(12) United States Patent
Olsen et al.

(10) Patent No.: US 12,669,353 B2
(45) Date of Patent: Jun. 30, 2026

(54) SYSTEMS AND METHODS TO INCREASE SENSOR ROBUSTNESS

(71) Applicant: Mound Laser & Photonics Center, Inc., Nashua, NH (US)

(72) Inventors: Clark T. Olsen, Dassel, MN (US); Michael W. Davis, Rockford, MN (US); Douglas P. Riemer, Waconia, MN (US); Matthew S. Lang, Excelsior, MN (US)

(73) Assignee: MOUND LASER & PHOTONICS CENTER, INC., Nashua, NH (US)

(*) Notice: Subject to any disclaimer, the term of this patent is extended or adjusted under 35 U.S.C. 154(b) by 1093 days.

(21) Appl. No.: 17/030,108

(22) Filed: Sep. 23, 2020

(65) Prior Publication Data

US 2021/0247218 A1 Aug. 12, 2021

Related U.S. Application Data

(60) Provisional application No. 62/972,564, filed on Feb. 10, 2020.

(51) Int. Cl.
*G01D 11/24* (2006.01)
*H05K 7/06* (2006.01)
(Continued)

(52) U.S. Cl.
CPC ............. *G01D 11/245* (2013.01); *H05K 7/06* (2013.01); *H05K 7/2039* (2013.01); *H05K 9/0079* (2013.01); *H05K 10/00* (2013.01)

(58) Field of Classification Search
CPC ........... H01L 23/564; H01L 2924/3025; H01L 23/562; H01L 2924/186; H01L 2924/181; G01D 11/245; G01D 3/036; G01D 3/028; G01D 11/24; G01D 11/26; G01K 1/16; G01K 1/18; H05K 2201/10151; G01L 1/2287; G01L 9/04; G01L 19/069
See application file for complete search history.

(56) References Cited

U.S. PATENT DOCUMENTS 4,991,283 A * 2/1991 Johnson ................... G01D 5/14
156/89.12
5,199,791 A 4/1993 Kasanami et al.
(Continued)

FOREIGN PATENT DOCUMENTS

EP 0460249 A1 * 12/1991 .......... G01L 1/2287
JP 4-43930 A 2/1992
(Continued)

OTHER PUBLICATIONS

Notification of Reasons for Rejection in Japanese Application No. 2021-018362, dated Oct. 29, 2024.

*Primary Examiner* — Judy Nguyen
*Assistant Examiner* — James Split
(74) *Attorney, Agent, or Firm* — McLane Middleton, Professional Association

(57) ABSTRACT

An apparatus is described. The apparatus including a substrate; one or more sensors and one or more electrical circuits formed on the substrate, the one or more electrical circuits electrically coupled with at least one of the one or more sensors; and a metal layer formed over the sensors, wherein the metal layer is positioned over the one or more sensors to provide a barrier.

25 Claims, 22 Drawing Sheets

(51) Int. Cl.

| | |
|---|---|
| *H05K 7/20* | (2006.01) |
| *H05K 9/00* | (2006.01) |
| *H05K 10/00* | (2006.01) |

(56) References Cited

U.S. PATENT DOCUMENTS

| | | | | |
|---|---|---|---|---|
| 5,202,211 | A * | 4/1993 | Vercoulen | C01G 19/02 |
| | | | | 430/137.16 |
| 5,242,225 | A * | 9/1993 | Kasanami | G01K 7/18 |
| | | | | 374/185 |
| 5,583,377 | A * | 12/1996 | Higgins, III | H01L 23/3675 |
| | | | | 257/E23.125 |
| 5,631,622 | A * | 5/1997 | Hauber | G01L 1/2287 |
| | | | | 156/247 |
| 5,804,462 | A * | 9/1998 | Liu | G01N 33/0031 |
| | | | | 438/702 |
| 6,532,824 | B1 * | 3/2003 | Ueno | G01P 15/125 |
| | | | | 73/780 |
| 6,701,782 | B2 * | 3/2004 | Iwaki | G01F 1/692 |
| | | | | 73/204.26 |
| 6,973,837 | B2 * | 12/2005 | Barnett | G01L 1/2256 |
| | | | | 73/765 |
| 7,094,061 | B1 * | 8/2006 | Kieffer | G01L 5/0047 |
| | | | | 73/862 |
| 7,106,167 | B2 * | 9/2006 | Parsons | H05B 3/265 |
| | | | | 374/E7.021 |
| 7,495,542 | B2 * | 2/2009 | Saio | G01K 7/00 |
| | | | | 338/25 |
| 7,719,007 | B2 * | 5/2010 | Tompkins | G01L 1/142 |
| | | | | 438/18 |
| 8,183,974 | B2 * | 5/2012 | Wienand | G01K 1/10 |
| | | | | 338/22 R |
| 9,606,006 | B2 * | 3/2017 | Wienand | C23C 16/06 |
| 11,150,073 | B2 * | 10/2021 | Hofmann | G01L 1/2287 |
| 2008/0265444 | A1 * | 10/2008 | Parsons | H01L 23/291 |
| | | | | 427/96.4 |
| 2019/0189570 | A1 * | 6/2019 | Quaglietta | H01L 23/3121 |
| 2019/0257780 | A1 * | 8/2019 | Le Neel | H01L 25/50 |

FOREIGN PATENT DOCUMENTS

| | | | | |
|---|---|---|---|---|
| JP | 2005-531770 A | 10/2005 | | |
| JP | 2020-10012 A | 1/2020 | | |
| WO | WO-9511433 A1 * | 4/1995 | .......... | G01L 1/2287 |
| WO | 2004/003943 A1 | 1/2004 | | |

* cited by examiner

302

UNDERSIDE VIEW

GAUGE

GROUND

SYSTEMS AND METHODS TO INCREASE SENSOR ROBUSTNESS

CROSS-REFERENCE TO RELATED APPLICATIONS

This application claims priority from U.S. Provisional Patent Application No. 62/972,564, filed on Feb. 10, 2020, which is hereby incorporated by reference in its entirety.

FIELD

Embodiments of the invention relate to systems and methods to increase the robustness of electrical components. In particular, embodiments of the invention relate generally to systems and methods for making electrical components more resistant to degradation.

BACKGROUND

Frequently, devices including circuits and sensors are deployed in environments that degrade one or more aspects of these devices and thereby inhibit their performance. Current techniques for forming circuits and sensors from metallic films or foils are limited in their ability to make the devices resistant to degradation. The shortcomings of current manufacturing techniques can result in low device durability and high maintenance costs. Further, the current techniques for increasing device durability can have long lead times and can be cost prohibitive to meet the desired size, usable life span, and performance characteristics.

SUMMARY

An apparatus is described. The apparatus including a substrate; one or more sensors and one or more electrical circuits formed on the substrate, the one or more electrical circuits electrically coupled with at least one of the one or more sensors; and a metal layer formed over the sensors, wherein the metal layer is positioned over the one or more sensors to provide a barrier.

Other features and advantages of embodiments of the present invention will be apparent from the accompanying drawings and from the detailed description that follows.

BRIEF DESCRIPTION OF THE DRAWINGS

Embodiments of the present invention are illustrated by way of example and not limitation in the figures of the accompanying drawings, in which like references indicate similar elements and in which.

DETAILED DESCRIPTION

Systems and methods to increase the robustness of devices are described. Devices include sensors and circuits formed using metallic films or foils. In various embodiments, devices comprise sensors including active and/or passive components integrated into one or more integrated electrical circuits. For example, sensors such as a resistance temperature detector (RTD) (e.g., formed from Nickel, Nickel-Chromium and/or platinum), thermocouple, strain gauge (e.g., formed from constantan), a capacitance sensor, a thermopile, a thermistor, heater (e.g., formed from NiChrome), reference electrodes (e.g., formed from Silver/ SilverChloride), electrical sensors/stimulators (e.g., formed from gold or platinum electrodes) such as for an electrocardiogram medical electromapping patch. The active and/or passive components include wireless communication components integrated with one or more electric circuits and/or other active and/or passive components. Methods of manufacturing devices that increase their robustness are also described.

For some embodiments, the one or more electrical circuits are formed on a substrate on a separate layer from the passive/active component. The one or more electrical circuits can be electrically coupled with one or more passive/ active components through one or more vias through an insulating layer, for example. Embodiments include multiple types of active/passive elements disposed on multiple layers, each type being on its own separate layer. However, some embodiments include one or more electrical circuits and one or multiple types of active/passive components disposed on the same layer. The active or passive component(s) can be constructed using techniques including, but not limited to, an additive thin film, plated, etched, and coated sensor material.

For some embodiments, one or more barriers are formed on one or more layers of active/passive elements included in the one or more electrical circuits. The barriers increase the robustness of the one or more electrical circuits by reducing the amount and/or rate of oxidation of the metallic film/foil layers of the electrical circuits. For some embodiments, the barriers inhibit oxidation by reducing the amount of moisture and or oxygen that penetrates into the metallic film/foil layers. By reducing the amount of oxidation of the metallic layers, the barriers preserve the electrical properties of the electrical circuits even in harsh environments allowing the sensors to maintain performance and accuracy over a long lifespan.

Figure 1:
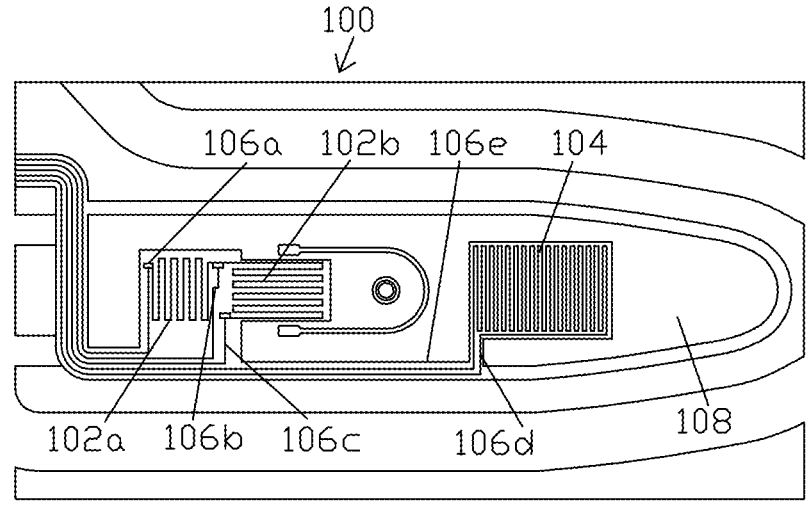
FIG. 1 illustrates a device including a plurality of sensors integrated with electrical circuits according to an embodiment.

FIG. 1 illustrates a device including a plurality of sensors integrated with electrical circuits according to an embodiment. The device 100 includes a plurality of strain gauge sensors 102 and an RTD sensor 104 electrically coupled with one or more electrical circuits through a plurality of traces 106. The sensors, the electrical circuits and the traces are integrally formed on the same substrate 108 using similar manufacturing techniques. This removes the need for discrete components to be added to a substrate including electrical circuits, which requires mounting pads for electrically coupling the discrete components to the electrical circuits. The discrete components including packaging and contacts to mount to the substrate require extra space. Further, the packaging of the discrete components and the mounting pads result in parasitic losses, such as capacitive and resistive losses, that can change the characteristics of the electrical circuits across each device and degrade performance of the electrical circuits from optimum operating characteristics.

A device including a plurality of active/passive components integrated with electrical circuits does away with the bulky packaging required for discrete components and the mounting pads. Thus, devices according to the embodiments described herein can have smaller dimensions because the integrated active/passive components do not have the packaging of discrete components and do not require mounting pads. Further, devices according to the embodiments described herein will not have the parasitic losses that result from mounting pads. In addition, the ability to manufacture the active/passive components with the electrical circuits disposed on the substrate enables better performance characteristics and tighter operating ranges since the active/ passive components and the electrical circuits are manufactured using similar techniques.

Figure 2:
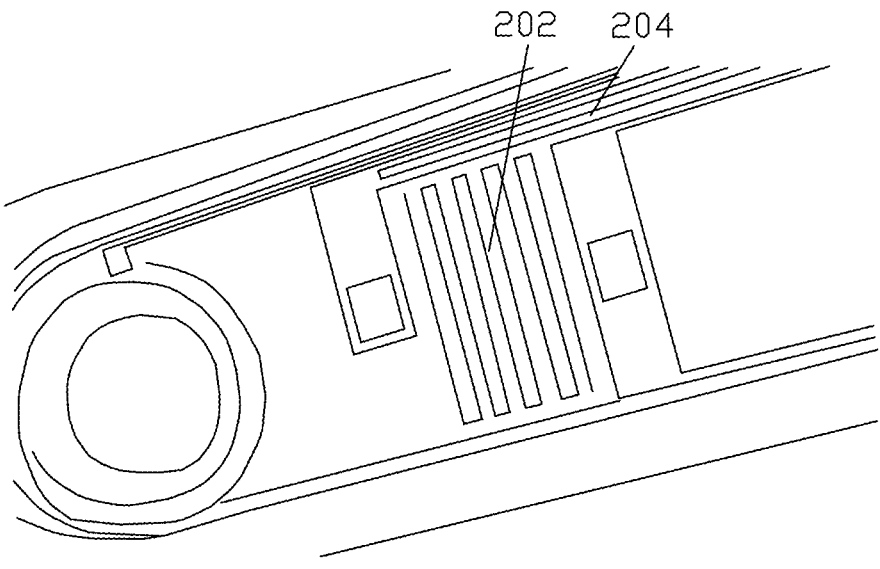
FIG. 2 illustrates an RTD integrated with electrical circuits according to an embodiment.

FIG. 2 illustrates an RTD integrated with electrical circuits according to an embodiment. The RTD component 202 is integrated with one or more electrical circuits 204 using techniques including those described herein.

FIGS. 3-18 illustrate a process for manufacturing a device including one or more active/passive components integrated with electrical substrates according to an embodiment. Integrally forming one or more active/passive components with electrical circuits on the same substrate enables the ability to miniaturize devices compared to the current state of devices, for example, that require the use of discrete components to be affixed to circuit boards. Further, integrally forming the one or more active/passive components with the electrical circuits on the same substrate enables the use of smaller packages. This also enables the devices according to embodiments described herein to be self-contained, which enables the devices to be used in harsher environments where devices not formed according to embodiments described herein would result in malfunctions or failure.

Figure 3:
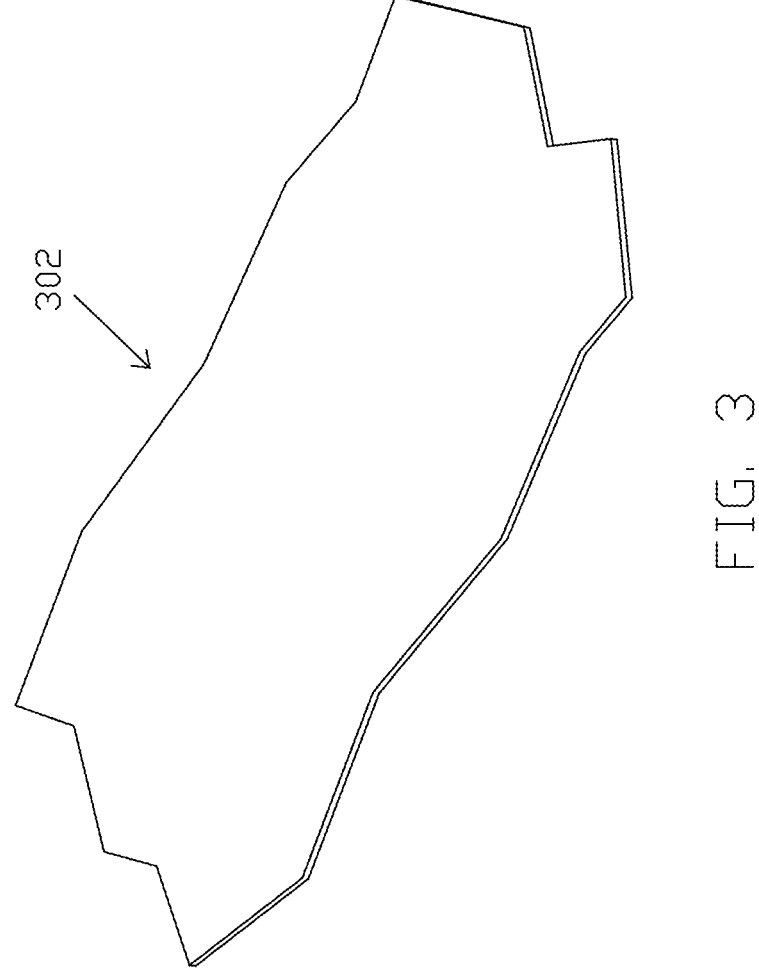
FIGS. 3-18 illustrate a process for manufacturing a device including one or more active/passive components integrated with electrical substrates according to an embodiment.

Referring to FIG. 3, a substrate 302 is prepared to form one or more active/passive components integrated with one or more electrical circuits. A substrate 302 may include, but is not limited to, stainless steel, copper, a polymer film, ceramic, glass, semiconductor, nitinol, and other materials. For some embodiments, the substrate 302 is in the form of a roll used in a reel to reel manufacturing process.

Figures 4A, 4B:
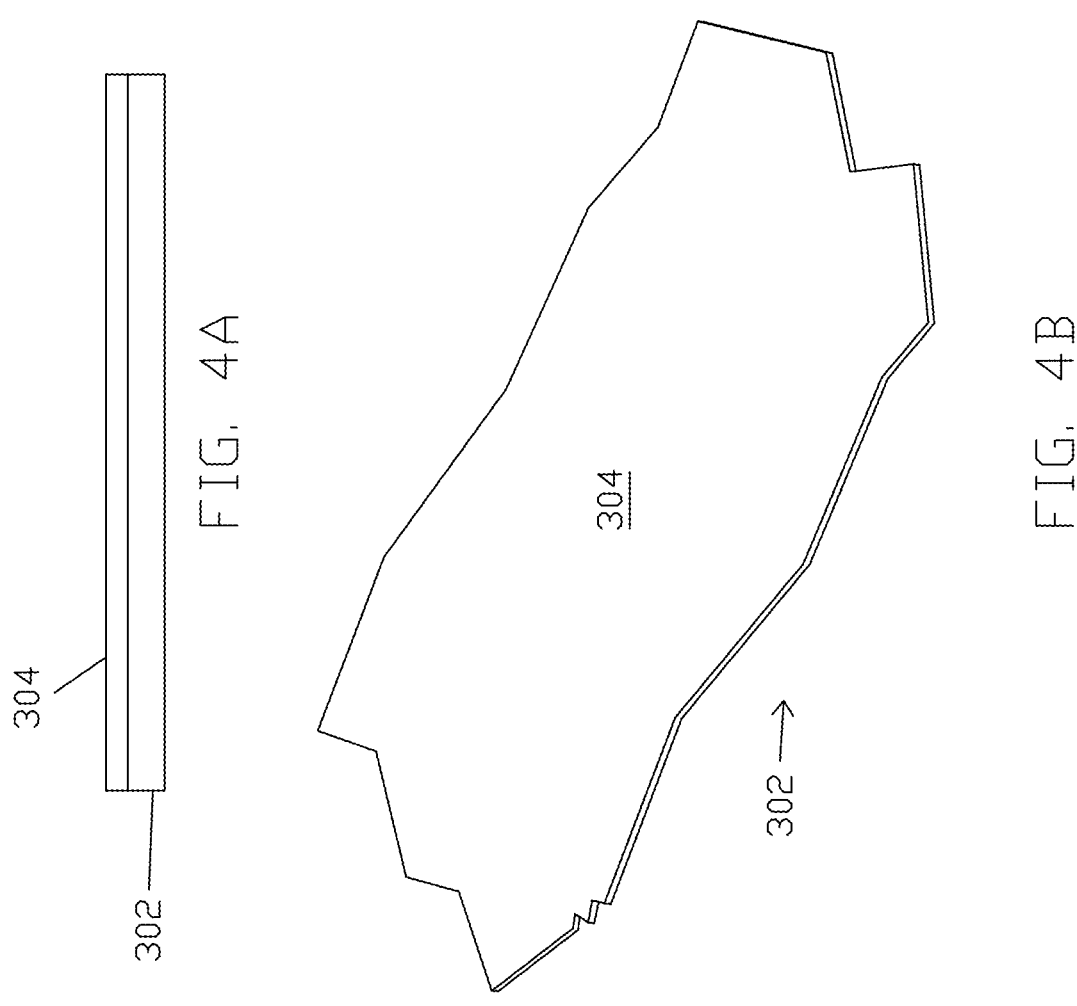

FIG. 4 illustrates a substrate with a dielectric layer disposed thereon. FIG. 4A illustrates a cross-sectional view of a substrate 302 with a dielectric layer 304 disposed thereon. FIG. 4B illustrates a perspective view of the substrate 302 with the dielectric layer 304 disposed thereon. A dielectric layer 304 is disposed on a substrate 302 according to some embodiments. For embodiments that do not use a conductive substrate, a dielectric layer 304 disposed on the substrate 302 may not be needed. The dielectric layer 304 includes, but is not limited to, a photoresist, polyimide, KMPR, and SU-8 or other insulating materials. For some embodiments, the dielectric layer 304 is disposed on the substrate 302 using a coating (liquid coating or dry film coating) technique. However, a dielectric layer 304 can be formed on the substrate 302 using other techniques including those known in the art.

Figures 5A, 5B:
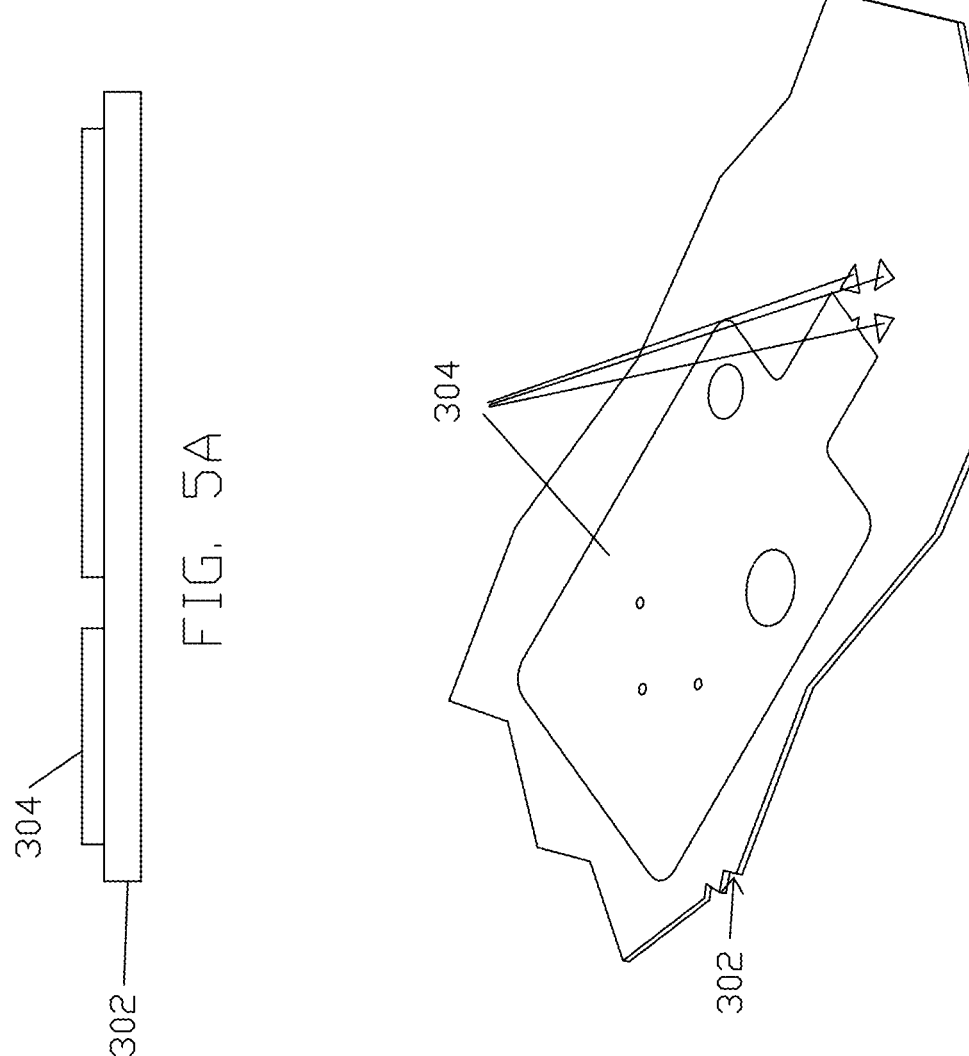

FIG. 5 illustrates a substrate with a dielectric layer that has been patterned according to an embodiment. FIG. 5A illustrates a cross-sectional view of a substrate 302 with a dielectric layer 304 that has been patterned according to an embodiment. FIG. 5B illustrates a perspective view of the substrate 302 with the dielectric layer 304 that has been patterned according to an embodiment. For some embodiments, a photoresist layer is formed on the dielectric layer 304. The photoresist, according to some embodiments, is exposed using photolithography techniques including those known in the art and developed using wet etch techniques including those known in the art. This patterned photoresist layer provides the pattern for the dielectric layer 304 during a dielectric removal process, either wet or dry techniques can be used. For other embodiments, the dielectric layer 304 is a photosensitive polyimide layer and is pattered directly using photolithography techniques including those known in the art and developed using wet etch techniques including those known in the art. Still another patterning method is laser ablation of the unwanted dielectric.

Figures 6A, 6B:
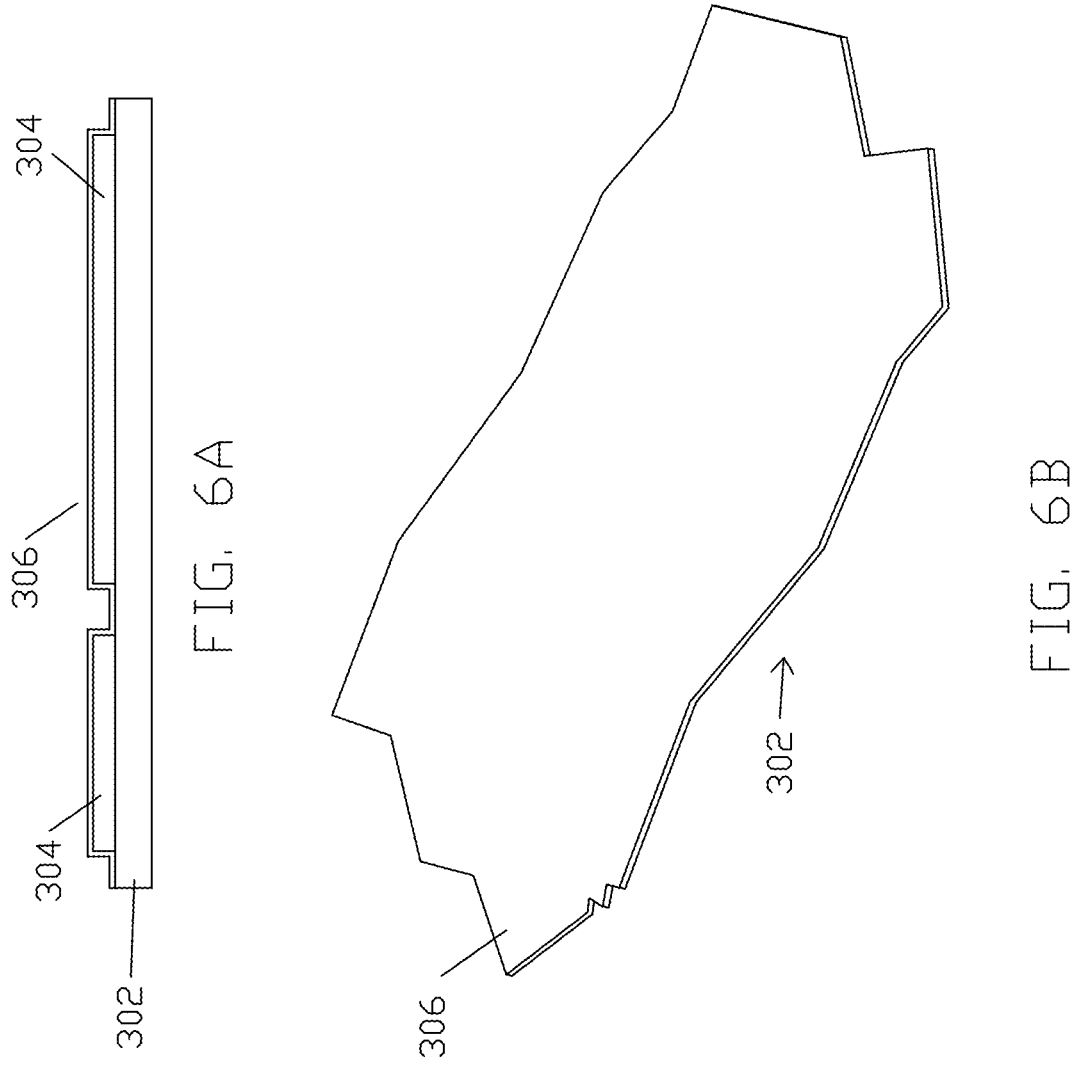

FIG. 6 illustrates a metal layer disposed on the dielectric layer according to an embodiment. FIG. 6A illustrates a cross-sectional view of a metal layer 306 disposed on the dielectric layer 304 according to an embodiment. FIG. 6B illustrates a perspective view of the metal layer 304 disposed on the dielectric layer 304 according to an embodiment. A metal layer 306 is formed on the dielectric layer 304 using techniques including, but not limited to, physical vapor deposition, chemical vapor deposition, and electroless chemical deposition. For some embodiments, a seed layer is formed on the dielectric layer 304 as a first step to forming a metal layer 306. For example, a seed layer such as nickel-chromium is sputtered on the dielectric layer 304. Copper, for example, is deposited on the seed layer using electroless chemical deposition. According to some embodiments, the metal layer 306 is used to form one or more sensors on the dielectric layer 304. For some embodiments, the metal layer 306 is constantan sputtered on the dielectric layer 304 to form one or more strain gauges.

According to some embodiments, forming sensors in the metal layer 304 includes depositing a photoresist layer on the metal layer, such as a constantan layer, and patterning the photoresist layer. The photoresist layer is applied using techniques including, but not limited to, liquid slot die, roller coat, spray, curtain coat, dry film lamination, and screen-printing techniques. The photoresist is patterned, for example, using photolithography and etching techniques including those known in the art. Portions of the metal layer 304 exposed by etching away portions of the photoresist layer are then etched to form sensors, electrical traces, electrical contacts, and other circuit components. According to some embodiments, laser ablation is used to form the sensors, electrical traces, electrical contacts, and other circuit components from the metal layer.

Figures 7A, 7B:
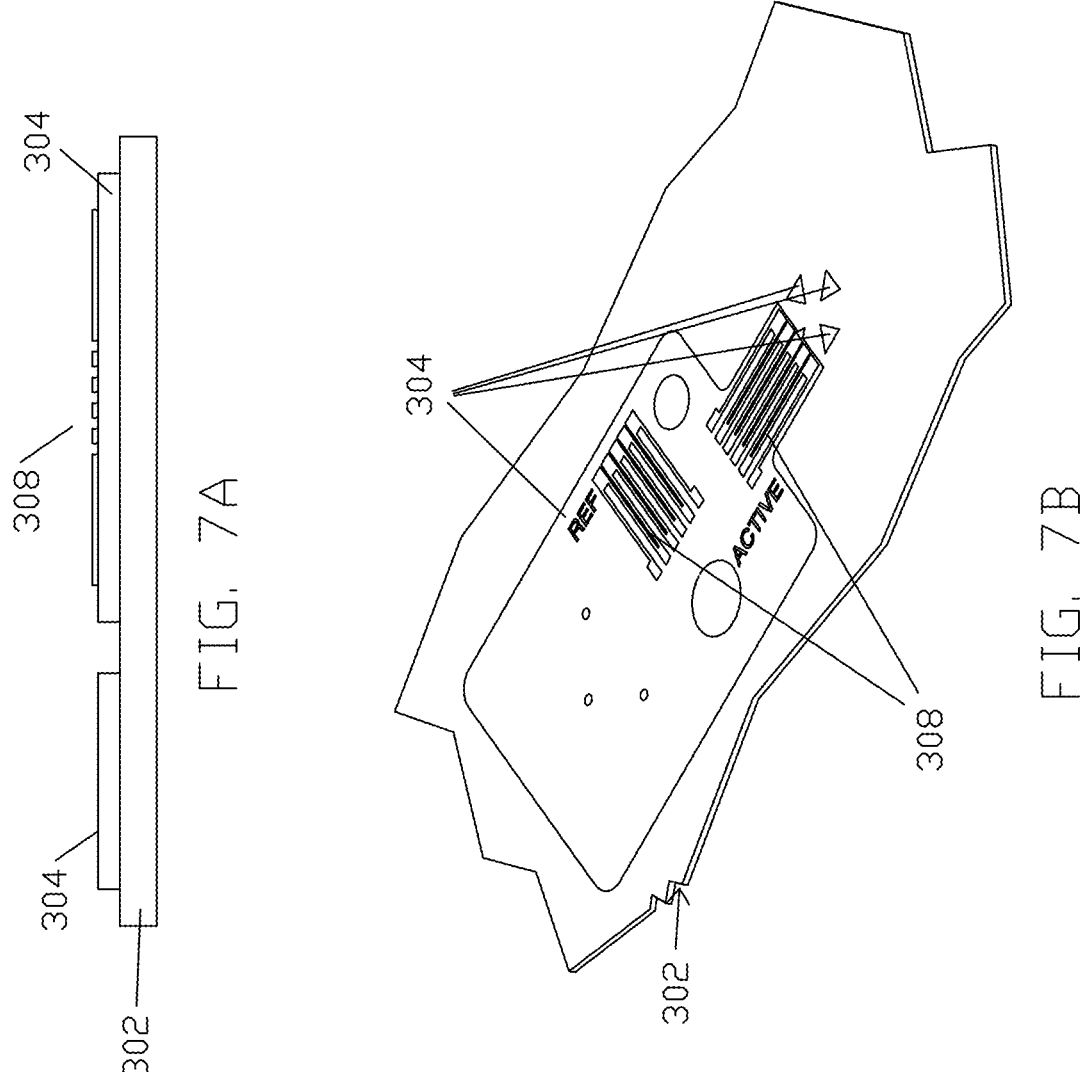

FIG. 7 illustrates strain gauges 308 formed on a dielectric layer 304 according to an embodiment. FIG. 7A illustrates a cross-sectional view of strain gauges 308 formed on a dielectric layer 304 according to an embodiment. FIG. 7B illustrates a perspective view of the strain gauges 308 formed on a dielectric layer 304 according to an embodiment. The metal layer 306 formed on the dielectric layer 304 is patterned and etched using techniques including those known in the art. For example, a photoresist is formed on the metal layer 306 using techniques including those known in the art. The photoresist is patterned and etched using techniques including those described herein.

Figures 8A, 8B:
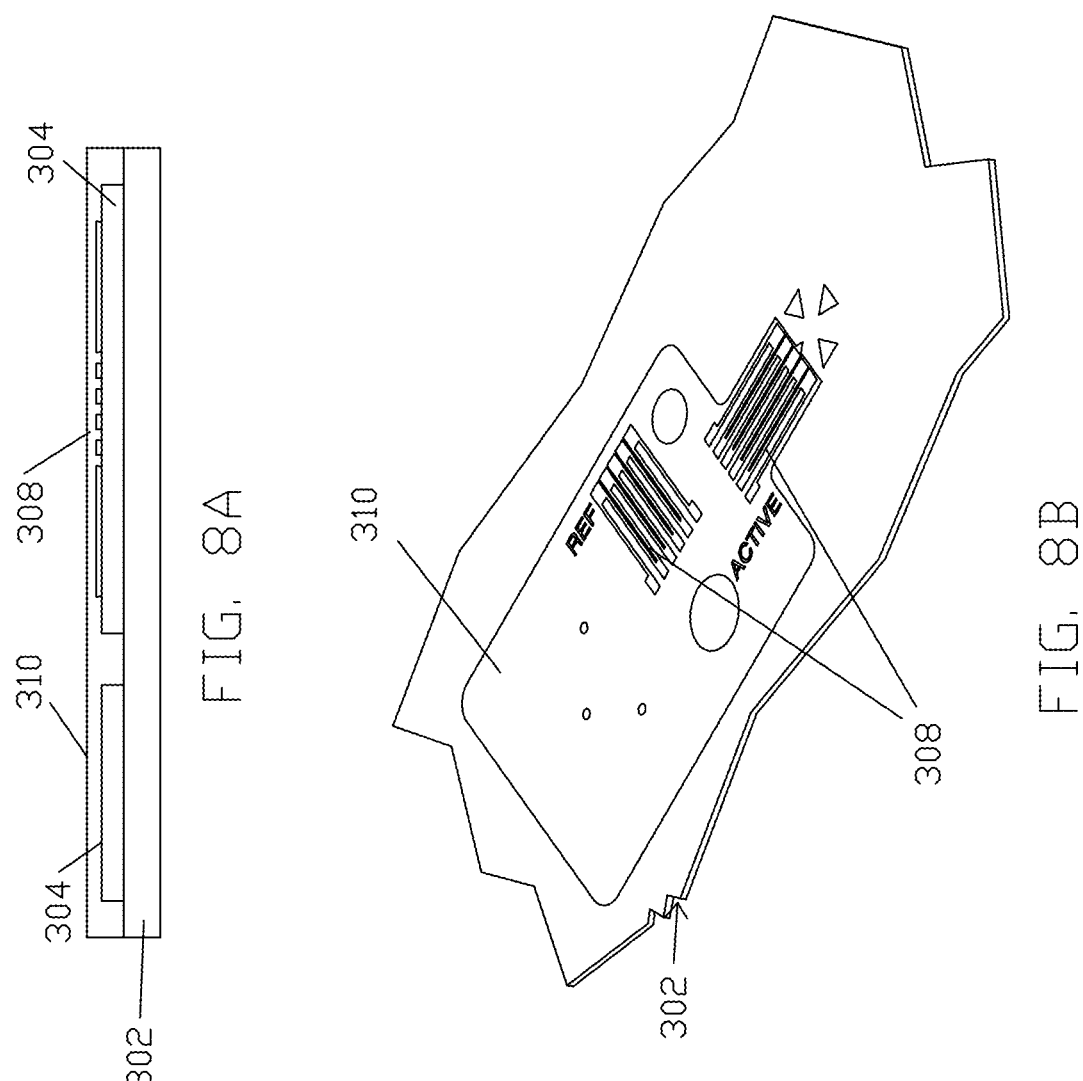

FIG. 8 illustrates a second dielectric layer formed over strain gauges according to an embodiment. FIG. 8A illustrates a cross-sectional view of a second dielectric layer 310 formed over strain gauges 308 according to an embodiment.

FIG. 8B illustrates a perspective view of the a second dielectric layer 310 formed over strain gauges 308 according to an embodiment. Once one or more sensors are formed on the first dielectric layer 304 as described herein, a second dielectric layer 310 is formed on the one or more sensors formed. Applying a second dielectric layer 310 after the one or more sensors are formed separates the sensor(s) from other structures formed in subsequent steps and protects the sensor(s) from damage than can occur during further processing of the device. For some embodiments, the second dielectric layer 310 is a polyimide layer formed using techniques including those described herein.

Figures 9A, 9B:
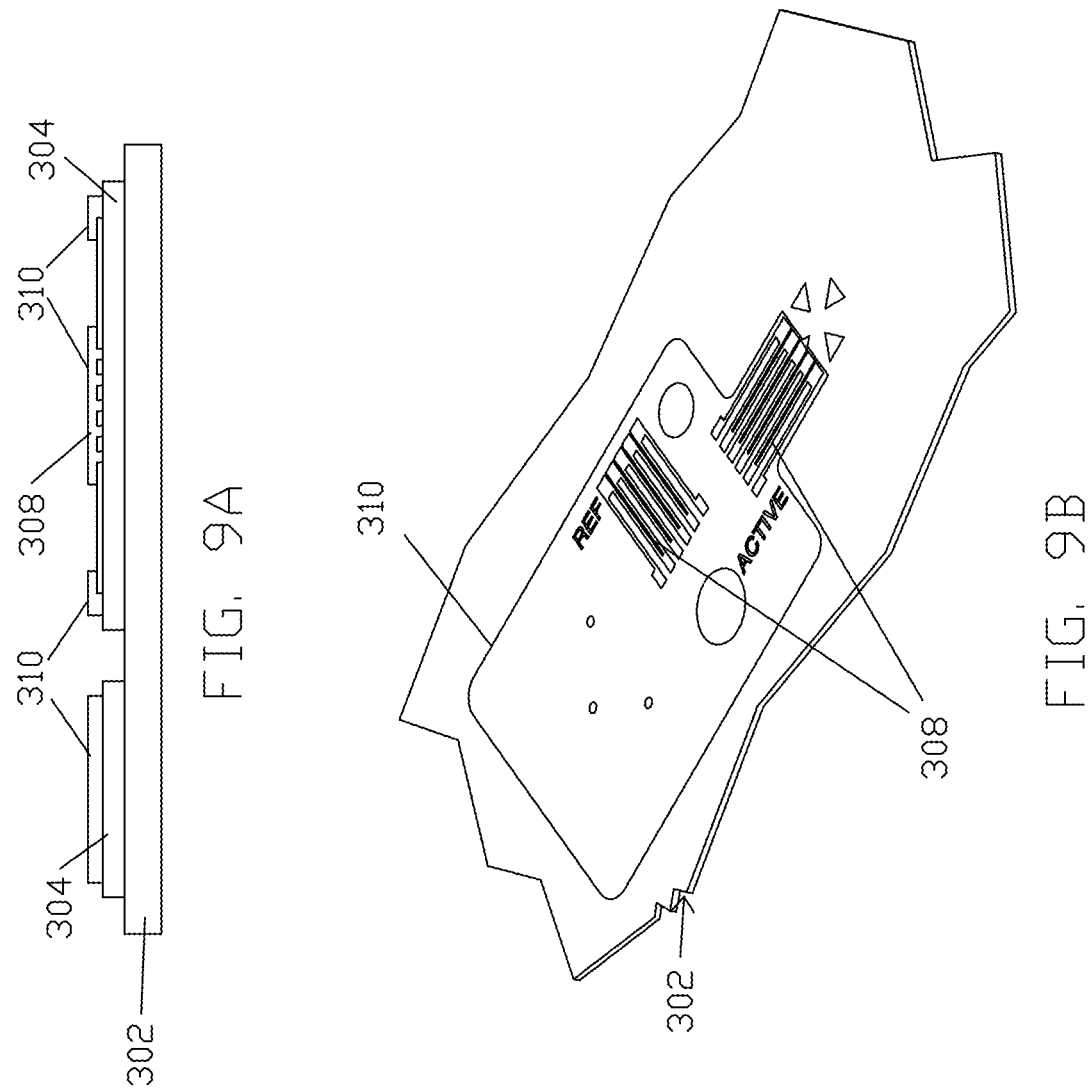

FIG. 9 illustrates a substrate 302 with a second dielectric layer that has been patterned according to an embodiment. FIG. 9A illustrates a cross-sectional view of a substrate with a second dielectric layer 310 that has been patterned according to an embodiment. FIG. 9B illustrates a perspective view of the substrate 302 with a second dielectric layer 310 that has been patterned according to an embodiment. The second dielectric layer 310 is pattered using photolithography techniques including those known in the art and developed using wet etch techniques including those known in the art.

Figures 10A, 10B:
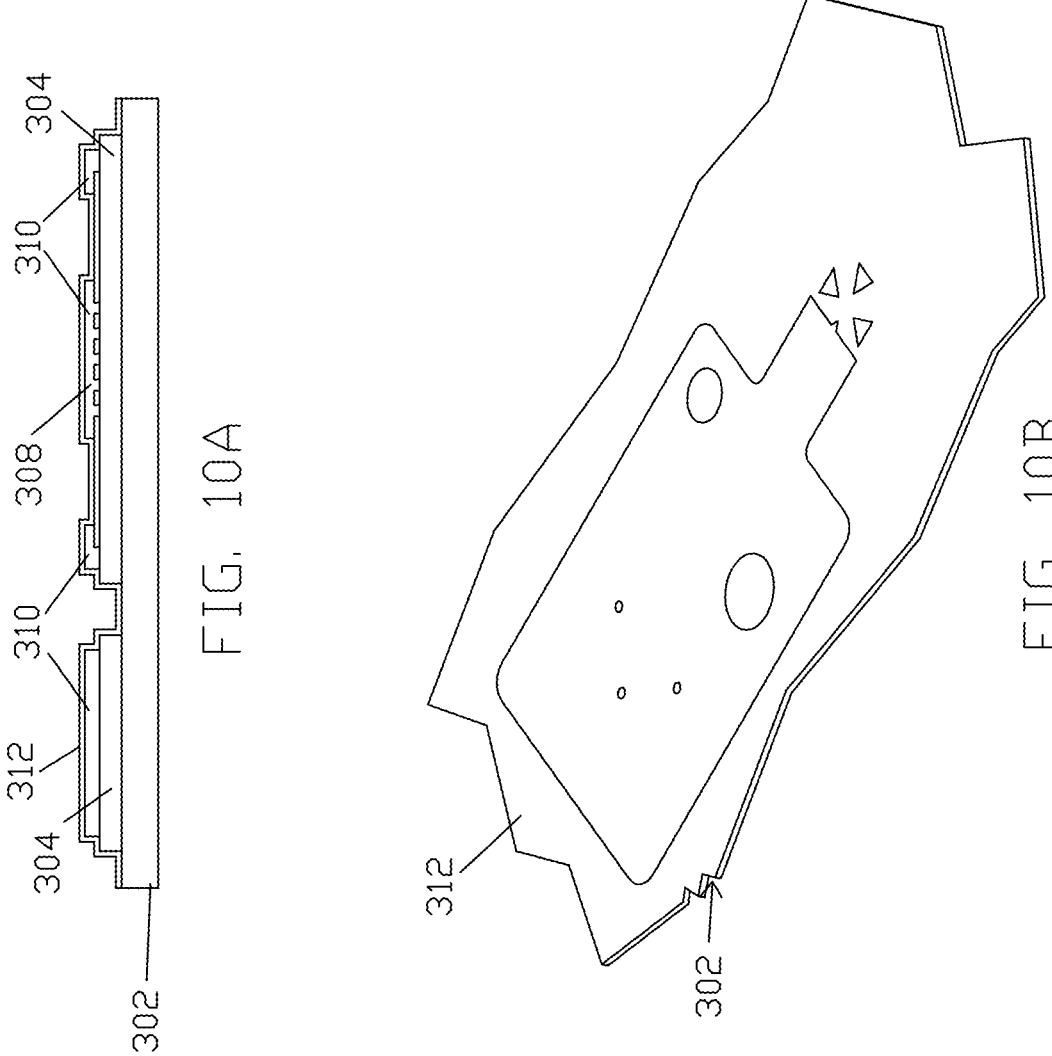
Figures 11A, 11B:
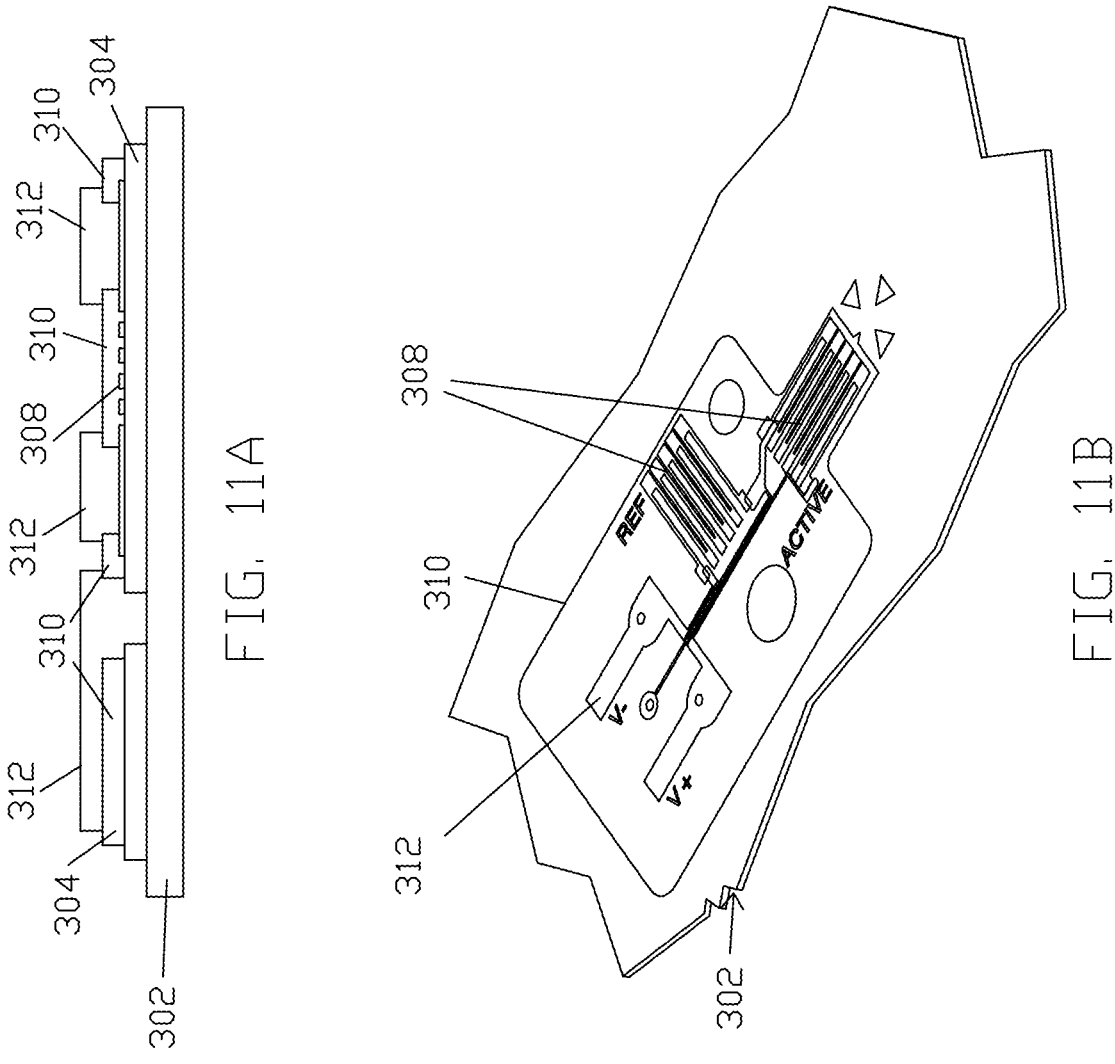

FIG. 10 illustrates a second metal layer 312 formed on the second dielectric layer 310 according to an embodiment. FIG. 10A illustrates a cross-sectional view of a second metal layer 312 formed on the second dielectric layer 310 according to an embodiment. FIG. 10B illustrates a perspective view of the second metal layer 312 formed on the second dielectric layer 310 according to an embodiment. The second metal layer 312 is formed on the second dielectric layer 310 using techniques including, but not limited to, physical vapor deposition, chemical vapor deposition, and electroless chemical deposition. For some embodiments, a seed layer is formed on a dielectric layer as a first step to forming a metal layer, such as the second metal layer 312. For example, a seed layer such as nickel-chromium is sputtered on the dielectric layer. Copper, for example, is deposited on the seed layer using electroless chemical deposition or electroplating. According to some embodiments, the second metal layer 312 is used to form one or more traces, vias, and electrical circuits. For example, the second metal layer 312 can include traces and vias to interconnect one or more sensors formed or to be formed on the substrate and connect the one or more sensors to other electrical circuits. FIG. 11 illustrates traces, electrical circuits, and vias formed from a metal layer using techniques according to an embodiment. FIG. 11A illustrates a cross-sectional view of traces, electrical circuits, and vias formed from a metal layer using techniques according to an embodiment. FIG. 11B illustrates a perspective view of the traces, electrical circuits, and vias formed from a metal layer using techniques according to an embodiment. For some embodiments, the second metal layer 312 is patterned to include one or more sensors and another dielectric layer is formed over the second sensor layer and another metal layer is formed to include traces, electrical circuits, and/or vias. Thus, one skilled in the art would understand any number of dielectric layers and patterned metal layers can be formed to include any number and type of sensors and electrical circuits using techniques including those herein.

Figures 12A, 12B:
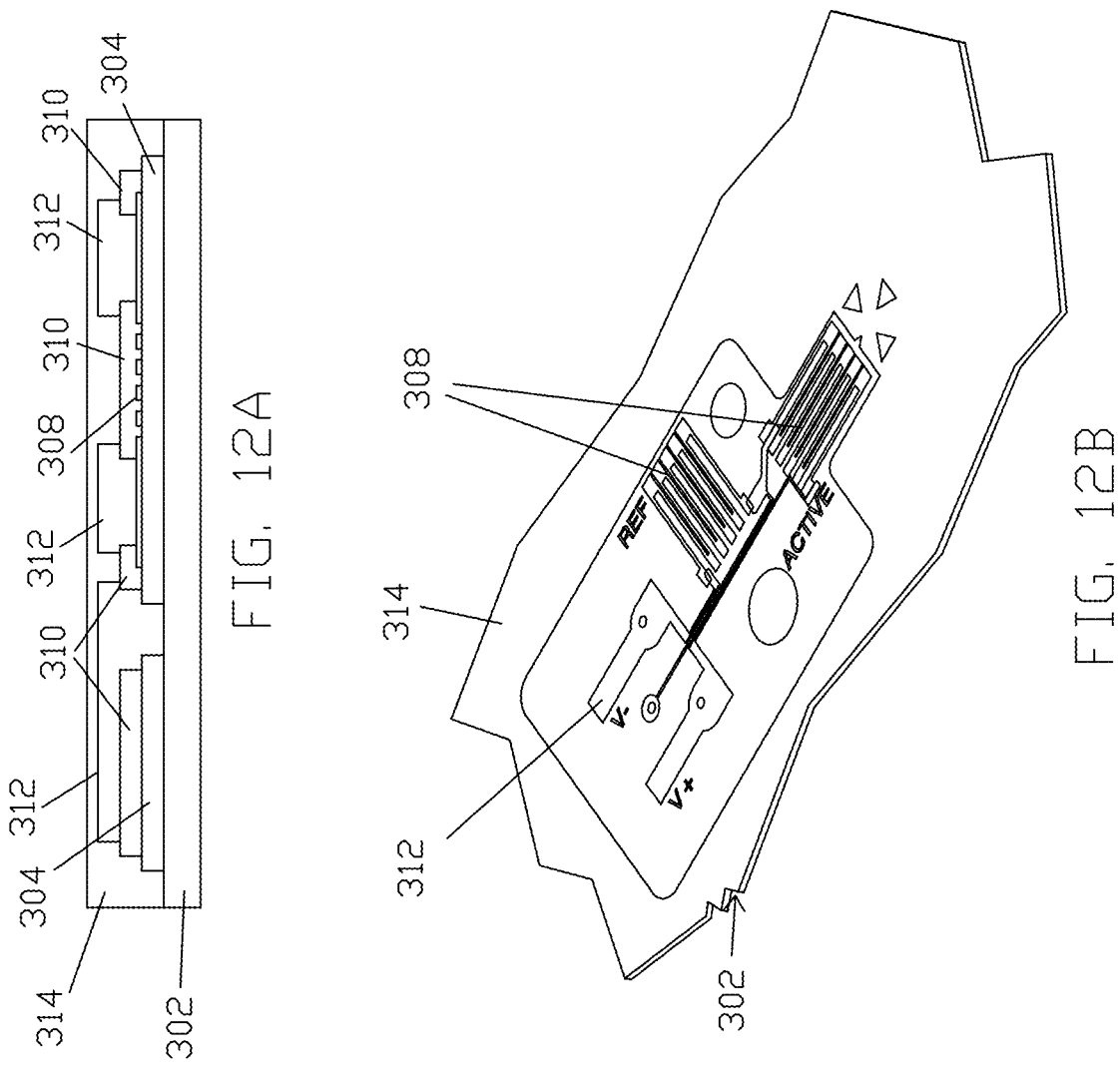

FIG. 12 illustrated a third dielectric layer 314 disposed on the patterned metal layer according to an embodiment. FIG. 12A illustrates a cross-sectional view of a third dielectric layer 314 disposed on the patterned metal layer according to an embodiment. FIG. 12B illustrates a perspective view of the third dielectric layer 314 disposed on the patterned metal layer according to an embodiment. The third dielectric layer 314 is formed using techniques including those described herein. For example, the third dielectric layer 314 is a polyimide layer.

Figures 13A, 13B:
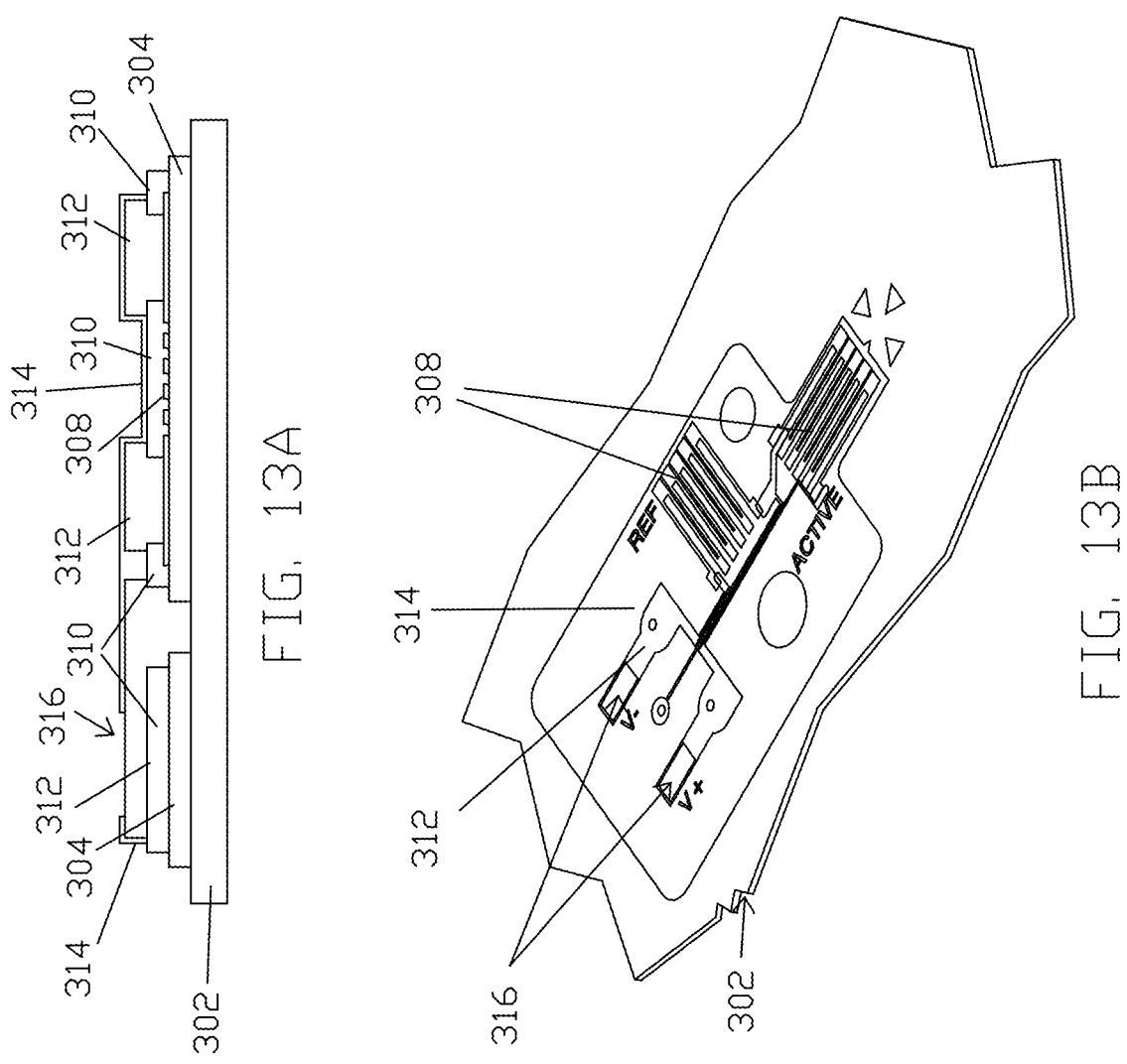

FIG. 13 illustrated the third dielectric layer 314 patterned to form one or more openings 316 in the third dielectric layer. FIG. 13A illustrates a cross-sectional view of the third dielectric layer 314 patterned to form one or more openings 316 in the third dielectric layer. FIG. 13B illustrates a perspective view of the third dielectric layer 314 patterned to form one or more openings 316 in the third dielectric layer. The dielectric layer is patterned using techniques including those described herein. For some embodiments, one or more openings 316 formed in the dielectric layer removes a portion of the dielectric layer to expose one or more of any of a trace, via, and an electrical circuit. Such openings are used, for example, to interconnect one or more electrical circuits and/or sensors to other electrical circuits and/or other sensors formed using techniques including those described herein.

Figures 14A, 14B:
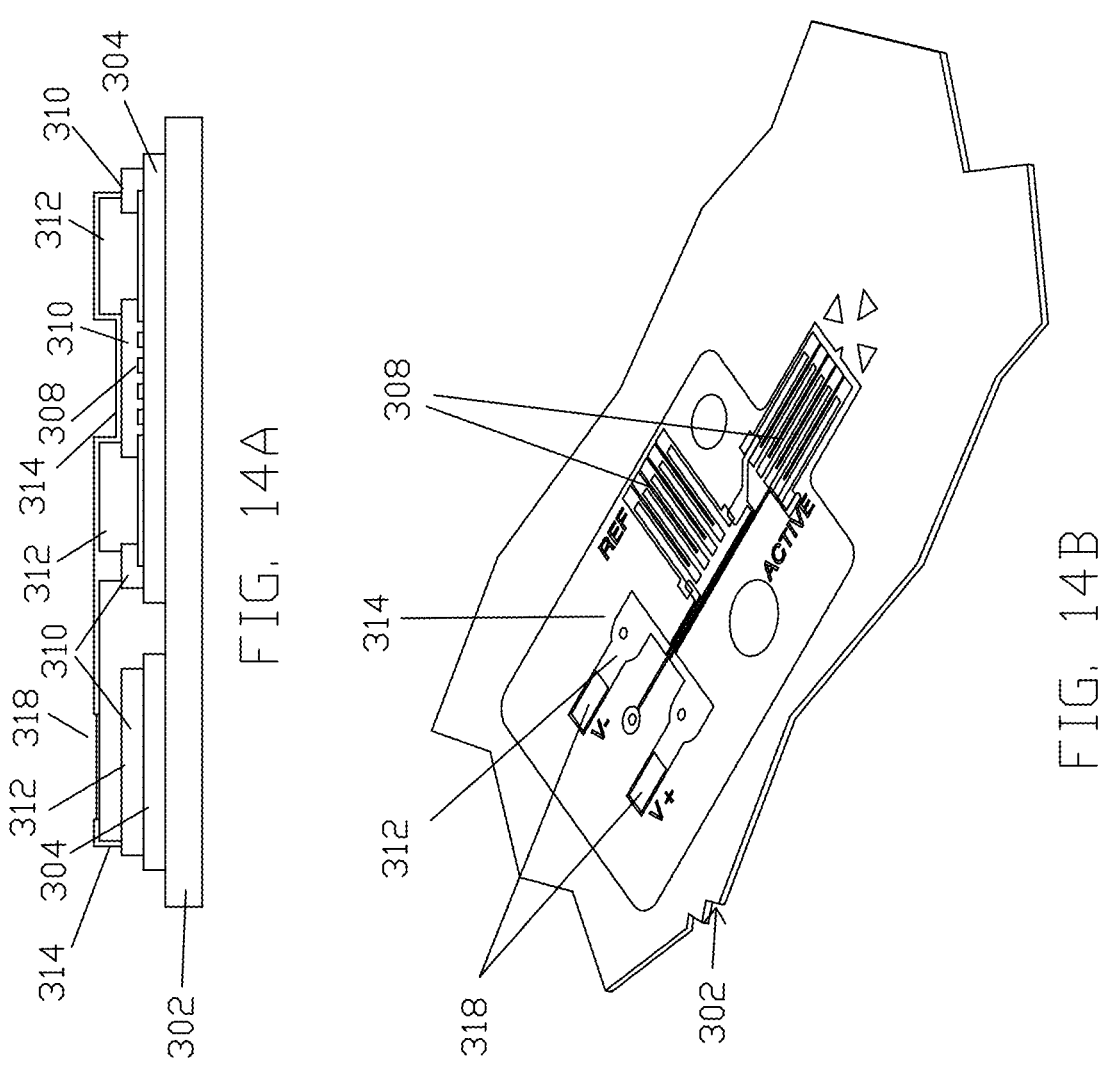
Figures 15A, 15B:
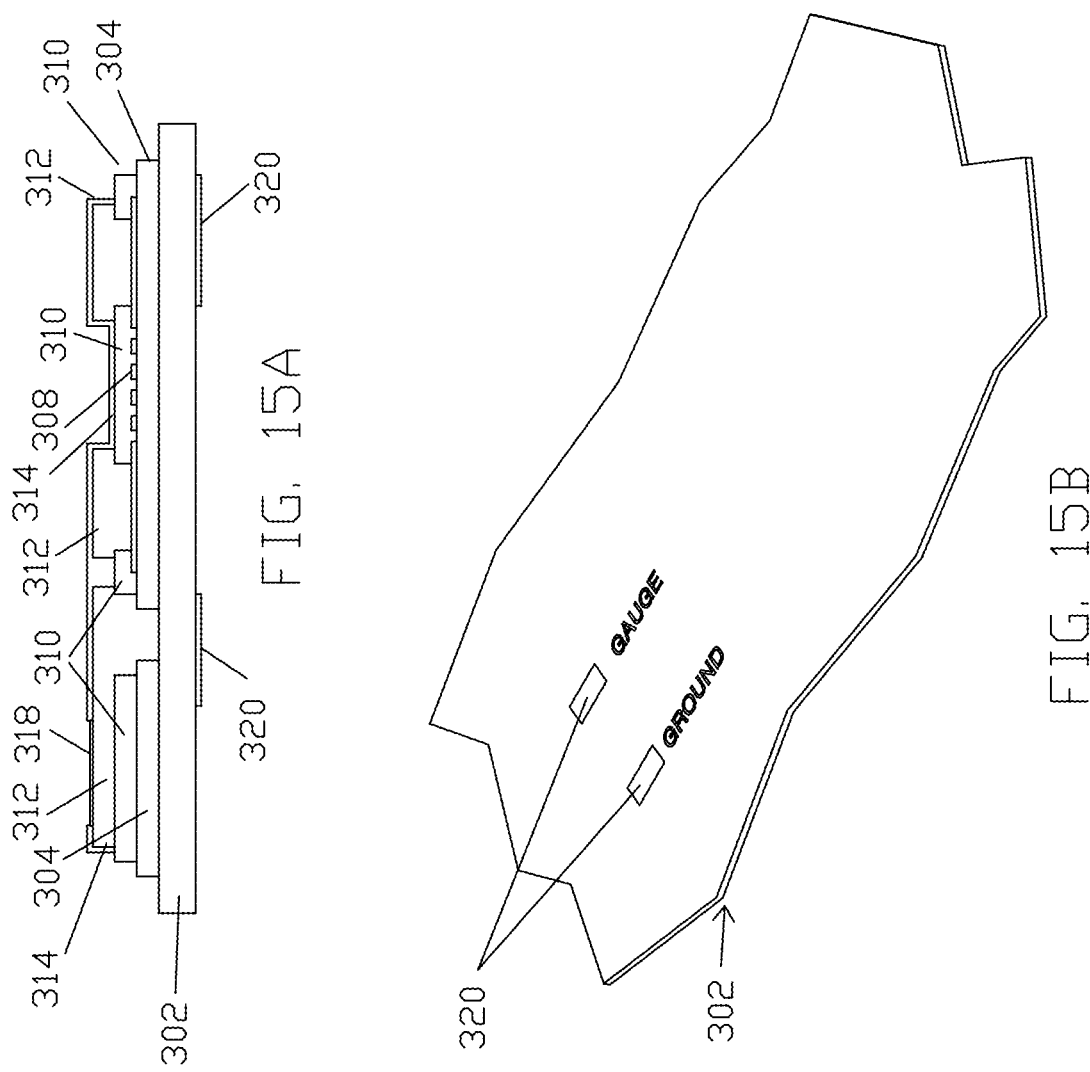

FIG. 14 illustrates gold plated pads 318 formed according to an embodiment. FIG. 14A illustrates a cross-sectional view of gold plated pads 318 formed according to an embodiment. FIG. 14B illustrates a perspective view of the gold plated pads 318 formed according to an embodiment. For some embodiments, one or more portions of the exposed metal layer is gold plated. For example, one or more portions are gold plated to form electrical contacts. The metal layer 312 is gold plated using one or more of deposition techniques and patterning techniques including those described herein. FIG. 15 illustrates gold plated pads 320 formed on a side of the substrate opposite from the side having the one or more dielectric layers and patterned metal layers formed thereon. FIG. 15A illustrates a cross-sectional view of gold plated pads 320 formed on a side of the substrate opposite from the side having the one or more dielectric layers and patterned metal layers formed thereon. FIG. 15B illustrates a perspective view of the gold plated pads 320 formed on a side of the substrate opposite from the side having the one or more dielectric layers and patterned metal layers formed thereon. The gold plated pads 320 are formed using one or more of deposition techniques and patterning techniques including those described herein. For such embodiments, the substrate 302 is a metal layer and the gold plated pads 320 formed on the substrate are used to form one or more ground and/or negative terminals for one or more electrical circuits and/or one or more sensors formed or to be formed on the device.

Figures 16A, 16B:
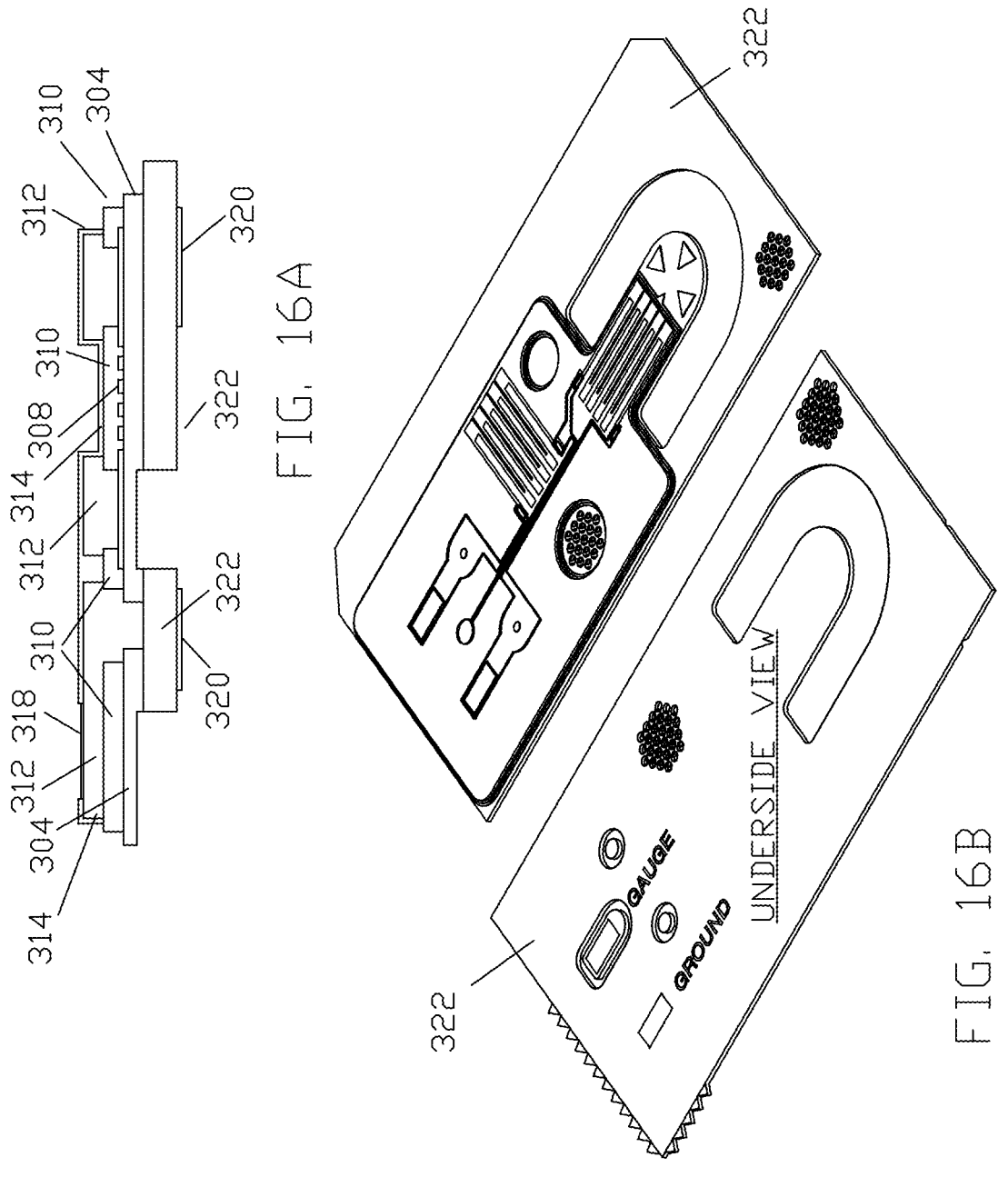
Figure 17:
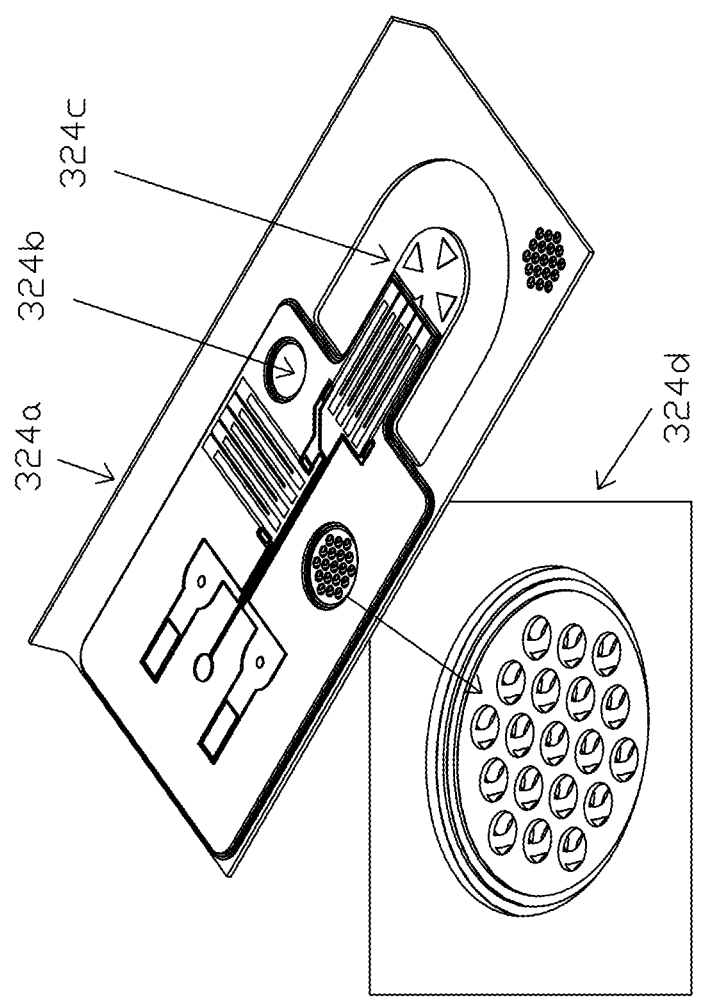

FIG. 16 illustrates a patterned substrate layer 322 according to an embodiment. FIG. 16A illustrates a cross-sectional view of a patterned substrate layer 322 according to an embodiment. FIG. 16B illustrates a perspective view of the patterned substrate layer 322 (the top side and the underside) according to an embodiment. The substrate is patterned using techniques described herein, for example, those related to patterning a metal layer. Further, the substrate could be patterned using laser ablation techniques including those known in the art. For some embodiments, the substrate is patterned to form at least a portion of one or more circuits and/or to give the device a desired shape. The desired shape can include, but is not limited to, shaping for a package, shaping for mounting, forming holes for mounting hardware, or forming other mechanical features. For some embodiments, the patterning includes forming textures or patterns in the substrate using patterning techniques including those described herein FIG. 17 illustrated the device formed to include mechanical features 324 according to an embodiment. For some embodiments, the device is patterned or molded to include mechanical features 324 that enable desired mechanical characteristics and/or for incorporation into system. For example, the substrate is bent or other molded to include a stiffener rail form. Other mechanical features 324 can also include one or more weld points for affixing the device into a system or for affixing another device or circuit to the substrate. Further, the substrate can be patterned using techniques including those described herein to include one or more high surface area adhesive attached features to enable better adhesion for adhesives applied to the subtracted. The adhesive can be applied to the substrate to affix one or more components or attached the device to a system.

Figure 18:
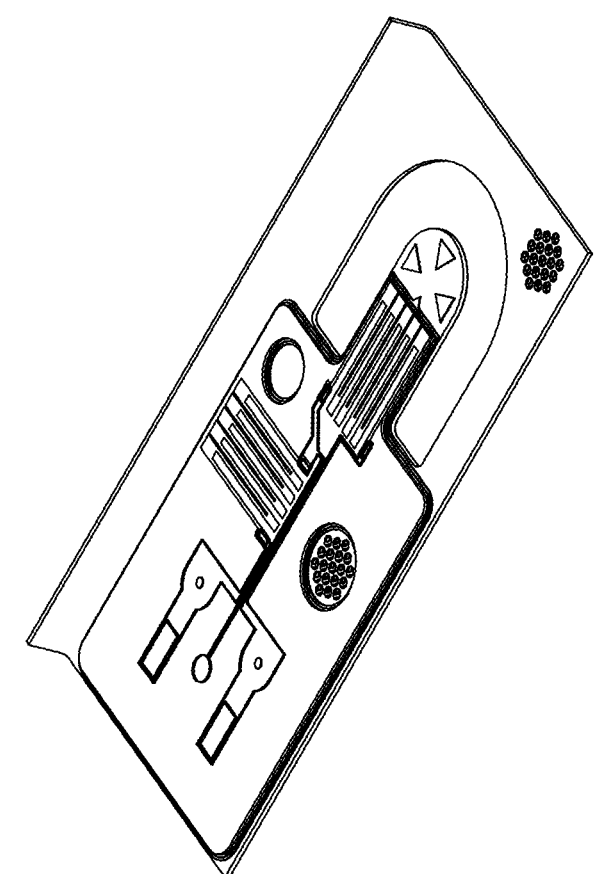

FIG. 18 illustrates a formed device according to an embodiment. The formed device may include one or more types of sensors including those described herein. Each type of sensor can be formed on a same layer as other sensors or can be formed on separate layers using techniques including those described herein. The formed device may also include one or more contact pads for mounted discrete components to the device, for example to complete one or more electrical circuits formed on the device. Further, the one or more contact pads can be configured to electrical couple the formed device to another system. For some embodiments, the one or more electrical circuits formed on the device can include electrical circuits configured as wireless communication circuits or portions thereof. For example, the device could include one or more coils, antennas, inductors, capacitors, stub features, or other elements of a wireless communication circuit.

For some embodiments, the one or more electrical circuits can be formed to include traces and other features having a line spacing in a range including, but not limited, to 8 microns to 12 microns. Other embodiments include a line spacing in a range including 12 microns to 50 microns. However, one skilled in the art would understand that larger and smaller line spacings could be used.

For some embodiments, a temperature sensor according to an embodiment is configured as a resistance temperature detector electrically coupled with a first electrical trace and a second electrical trace. The temperature sensor is configured as a serpentine line disposed on a dielectric layer. The serpentine line is electrically connected to the first electrical trace at a first end of the serpentine line and is electrically connected to the second electrical trace at a second end of the serpentine line.

According to some embodiments, the substrate is attached to a web of a reel to reel manufacturing process to form one or more sensors and/or electrical circuits as described herein. The reel to reel manufacturing process forms and patterns any metal layers and any dielectric layers and the one or more sensors and electrical circuits using techniques including those describe herein.

Figure 19:
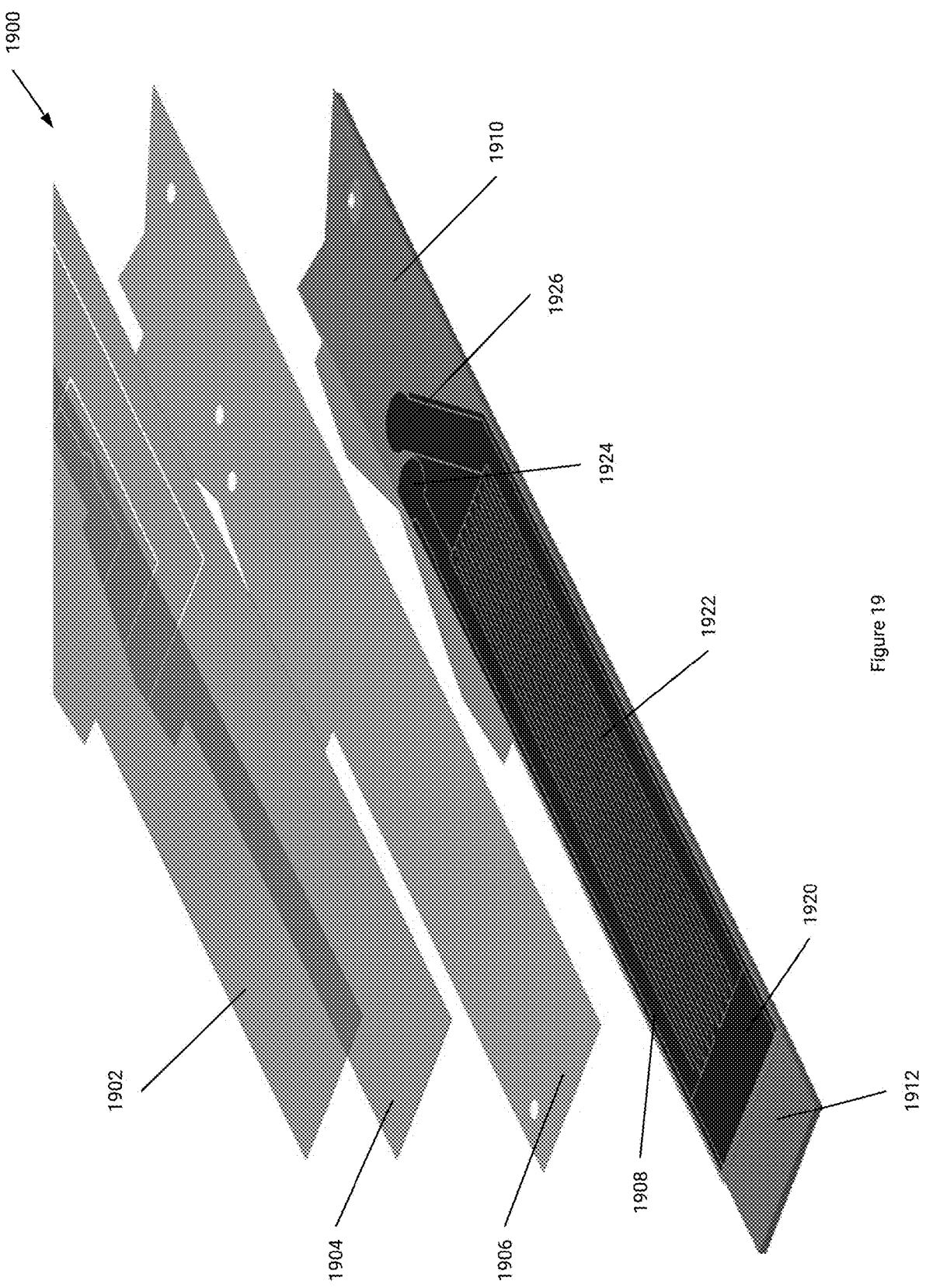
FIG. 19 illustrates a device including a barrier for increasing the robustness of the device according to an embodiment.

FIG. 19 illustrates a device 1900 formed according to an embodiment of the manufacturing process described above in FIGS. 3-18. For some embodiments, the device 1900 includes active and/or passive components integrated into one or more integrated electrical circuits. For example, sensors such as a resistance temperature detector (RTD), thermocouple, strain gauge, capacitance sensor, thermopile, thermistor, heater, reference electrodes, and electrical sensors/stimulators such as for electrocardiography medical electromapping patch.

For some embodiments, the sensor 1922 is formed on a substrate 1912 with a first dielectric layer 1910 deposited thereon. The substrate 1912 includes, but is not limited to, stainless steel, copper, a polymer film, ceramic, glass, semiconductor, nitinol, and other materials. For some embodiments, the substrate is 1912 a thin metallic film/foil having a thickness in a range including, but not limited to, 50 to 100 microns. However, one skilled in the art would understand that a substrate 1912 having a larger or smaller thickness could be used.

The first dielectric layer 1910 is deposited on the substrate 1912 using a deposition technique described above. The first dielectric layer 1910 includes, but is not limited to, a photoresist, polyimide, KMPR, and SU-8 or other insulating materials. For some embodiments, the first dielectric layer 1910 is patterned using a photoresist layer formed on the first dielectric layer 1910. For other embodiments, the first dielectric layer 1910 is a photosensitive polyimide layer that is patterned directly using photolithography techniques. The first dielectric layer 1910 has a thickness in a range including, but not limited to, 5 to 10 microns according to an embodiment. However, one skilled in the art would understand that a first dielectric layer 1910 having a larger or smaller thickness could be used.

For some embodiments, a metal layer 1908 is formed on the first dielectric layer 1910. For example, the metal layer 1908 includes, but is not limited to, a copper layer deposited on a seed layer of nickel-chromium sputtered on the first dielectric layer 1910 or a layer of constantan sputtered on the first dielectric layer 1910. For some embodiments, the metal layer 1908 is used to form one or more sensors on the dielectric layer. For example, a resistance temperature detector (RTD), thermocouple, strain gauge, capacitance sensor, thermopile, thermistor, heater, reference electrodes, and electrical sensors/stimulators such as for electrocardiogram medical electromapping patch. For some embodiments, the sensor 1922 is a quarter bridge strain gauge that determines strain based on resistance measured for at one or more terminals. According to an embodiment, the sensor 1922 includes a voltage terminal 1920 that receives an input voltage and prime terminal 1926 and a redundant terminal 1924 that yield two measures of resistance across the quarter bridge circuits.

For some embodiments, a second dielectric layer 1906 is formed over the one or more sensors 1922 formed in the metal layer 1908. Applying a second dielectric layer 1906 after the one or more sensors 1922 are formed separates the sensor(s) 1922 from other structures formed in subsequent steps and protects the sensor(s) 1922 from damage than can occur during further processing of the device 1900. For some embodiments, the second dielectric layer 1906 is a polyimide layer formed using techniques including those described herein. According to an embodiment, the second dielectric layer 1906 is patterned using photolithography techniques including those known in the art and developed using wet etch techniques including those known in the art. The second dielectric layer 1906 has a thickness in a range including, but not limited, to 5 to 10 microns according to an embodiment. However, one skilled in the art would understand that a second dielectric layer 1906 having a larger or smaller thickness could be used.

For some embodiments, a second metal layer 1904 is formed on the second dielectric layer 1906. The second metal layer 1904 is a barrier positioned over the sensor 1922 formed in a metal layer 1908. For some embodiments, the barrier created by the second metal layer 1904 prevents oxidation of the sensor material by inhibiting the penetration of moisture and/or oxygen from the device's external environment onto the sensor 1922 formed in the metal layer 1904. To increase the durability and robustness of the sensor 1922, the second metal layer covers the surface of the sensor 1922 and limits the areas of the sensor 1922 that are uncovered and/or exposed to the external environment. The second metal layer 1904 is, for example, a sputtered copper-chromium layer, a sputtered chrome layer, or a plated copper layer.

For some embodiments, in addition to forming a barrier that prevents oxidation, the second metal layer 1904 is used to form one or more traces, vias, and electrical circuits. For example, the second metal 1904 layer can include traces and vias to interconnect one or more sensors 1922 formed or to be formed on the substrate 1912 and connect the one or more sensors 1922 to other electrical circuits. For some embodiments, the second metal layer 1904 is patterned to include one or more sensors and another dielectric layer is formed over the second sensor layer and another metal layer is formed to include traces, electrical circuits, and/or vias. The second metal layer 1904 has a thickness of but not limited to 12 microns according to an embodiment. However, one skilled in the art would understand that a second metal layer 1904 having a larger or smaller thickness could be used.

For some embodiments, a third dielectric layer 1902 is formed on the second metal layer 1904. The third dielectric layer 1902 is formed using techniques including those described herein. The third dielectric layer 1902 includes, but is not limited to, a polyimide layer. The third dielectric layer 1902 has a thickness in a range including but not limited to 5 to 10 microns according to an embodiment. However, one skilled in the art would understand that a third dielectric layer 1902 having a larger or smaller thickness could be used. One skilled in the art would understand that other arrangements of metal layers and dielectric layers according to embodiments can be used to achieve the benefits described herein.

Figure 20:
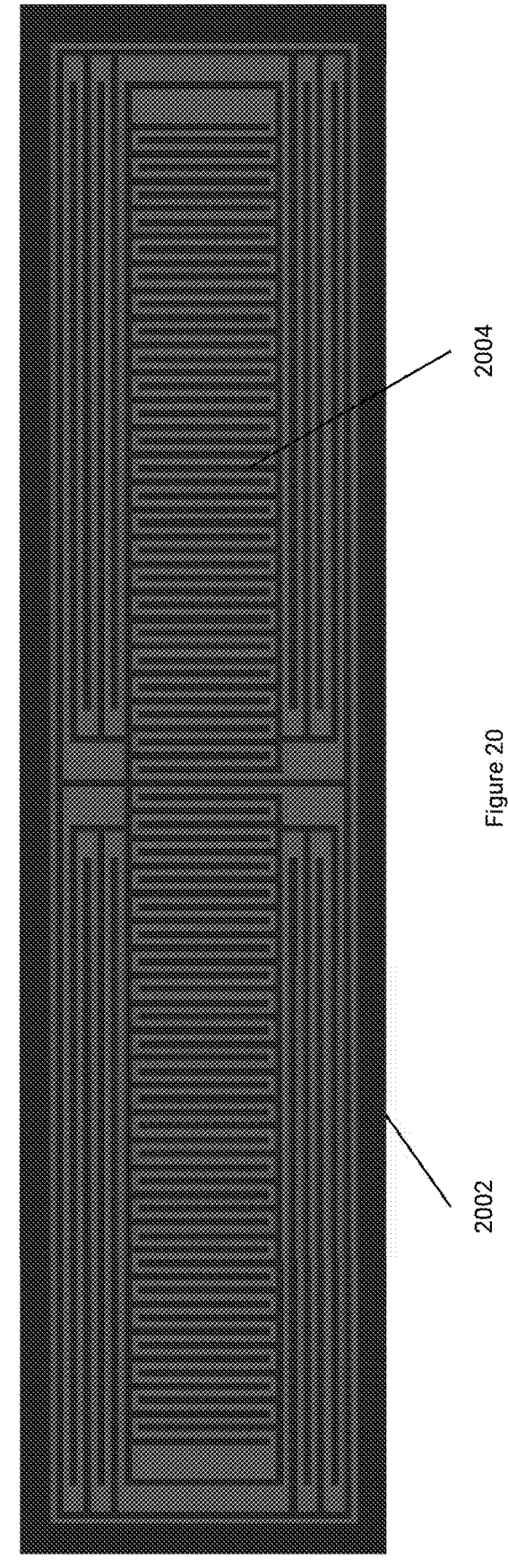
FIG. 20 illustrates a border security feature of a sensor according to an embodiment.

FIG. 20 shows an exemplary sensor 2000 embodiment including a border security feature 2002. For some embodiments, the border security feature 2002 is an extra ring of non-active sensor material formed around the outside of the sensor 2000. The border security feature 2002 includes, but is not limited to, a metallic material (e.g., constantan). For some embodiments, the border security feature 2002 prevents moisture ingress into the circuits 2004 of the sensor 2000 and acts as a sacrificial anode that is consumed by oxidation before the internal metallic components of the sensor 2000. For some embodiments, the sensor 2000 is formed in the metal layer of the devices described herein. The sensor 2000 is formed using techniques including those described herein.

Figure 21:
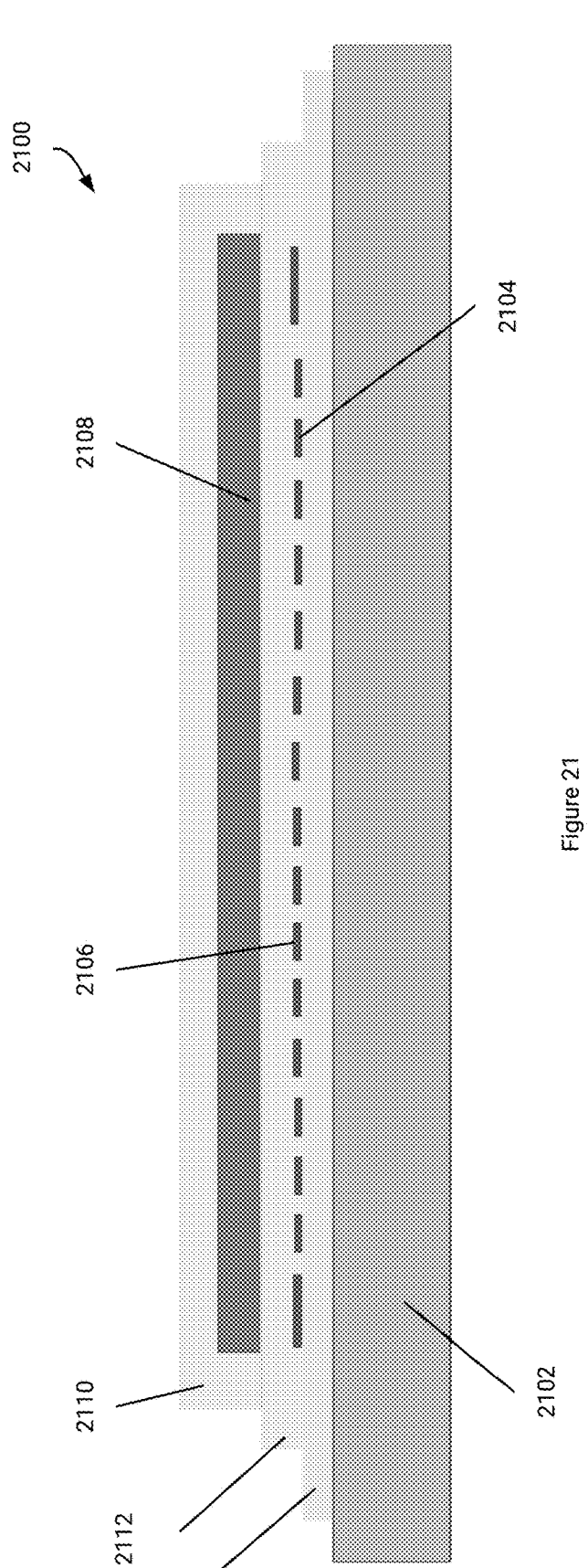
FIG. 21 illustrates a cross sectional view of a device including a barrier for increasing the robustness of the device according to an embodiment.

FIG. 21 illustrates a cross sectional view of a device 2100 including a barrier for increasing robustness of the device 2100 according to an embodiment. The device 2100 includes a substrate 2102 having a first dielectric layer 2114 formed on the substrate 2102. For some embodiments, the substrate 2102 is a stainless steel film/foil and the first dielectric layer 2114 includes, but is not limited to, a photoresist, polyimide, KMPR, and SU-8 or other insulating materials. A first metal layer 2104 is formed on the first dielectric layer 2114. For some embodiments, the first metal layer 2104 is patterned to form a sensor in the first metal layer 2104. The sensor is a strain gauge according to an embodiment. The first metal layer 2104 has a border barrier 2106 formed around the exterior of the sensor. For some embodiments, the border barrier 2106 is an extra ring of non-active sensor material that includes, but is not limited to, constantan or other metallic materials formed on the first dielectric layer 2114 around the exterior surface of the sensor. The border barrier 2106 is positioned around the exterior of the sensor as a physical barrier to help prevent moisture ingress onto the sensor formed in the first metal layer 2104 and act as sacrificial anode that is oxidized before the sensor material in the presence of moisture/air.

The device 2100 includes a second dielectric layer 2112 formed on the first metal layer 2104 according to an embodiment. The second dielectric layer 2112 insulates and/or separates the first metal layer 2104 from other active/non-active layers of the device 2100. A second metal layer 2108 is formed on the second dielectric layer 2112 according to an embodiment. The second metal layer 2108 includes, but is not limited to, a layer of copper plated on the second dielectric layer 2112 over the first metal layer 2104. For some embodiments, the second metal layer 2108 is plated on the second dielectric layer 2112 using techniques including those described herein. The second metal layer 2108 is positioned over the sensor formed in the first metal layer 2104 to act as a physical barrier that seals the metallic sensor material from moisture and oxygen penetration.

For some embodiments, the second metal layer 2108 is a thermally conductive material that includes but is not limited to plated copper. The thermally conductive property of the second metal layer 2108 allows the barrier to provide a thermal spreading effect that distributes temperature over the surface of the sensor. This thermal spreading effect enhances the accuracy of sensors that sense temperature or have their performance effected by temperature. For example, the resistance of wires included in an electrical circuit integrated into a strain gauge (e.g., a quarter bridge strain gauge) or a temperature sensor (e.g., a resistance temperature detector) varies with temperature, therefore, by equilibrating the temperature across the surface of the sensor, the second metal layer 2108 improves the performance of the sensor. The device 2100 includes a third dielectric layer 2110 formed on the second metal layer 2108 according to an embodiment.

Figure 22:
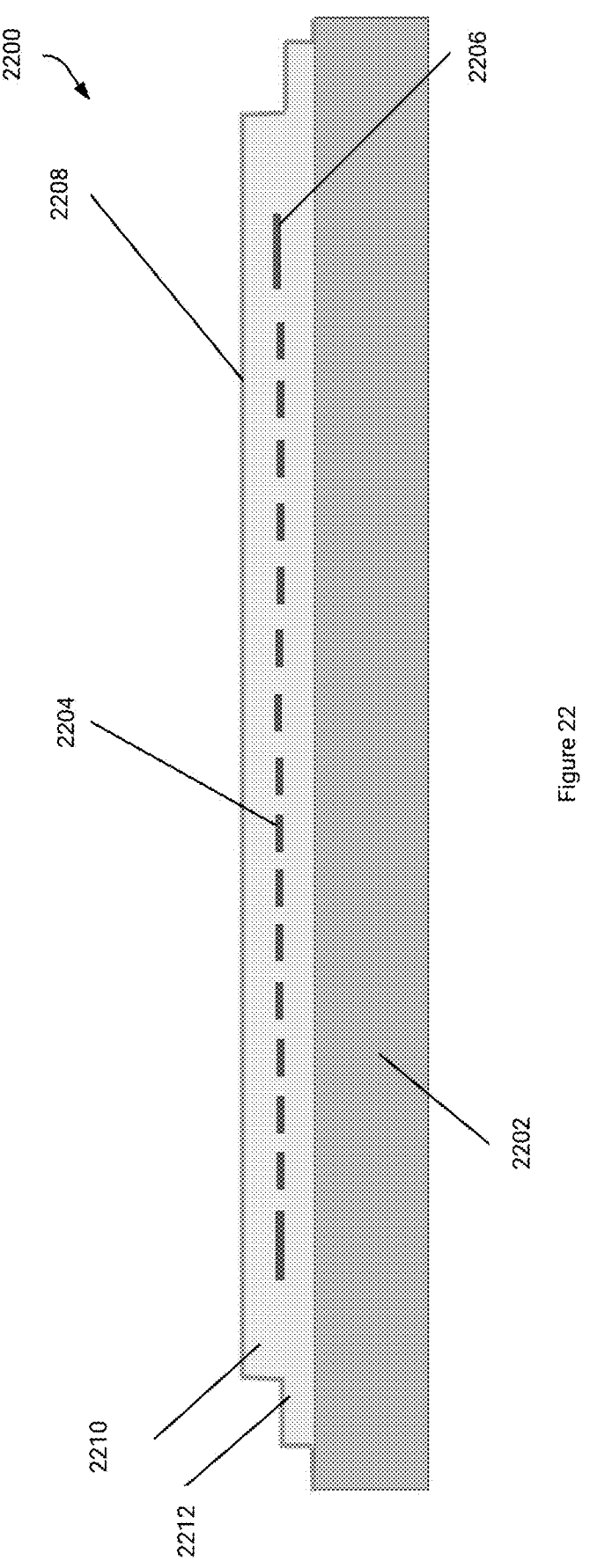
FIG. 22 illustrates a cross sectional view of a device including a barrier for increasing the robustness of the device according to an embodiment.

FIG. 22 illustrates a cross sectional view of a device 2200 including a barrier for increasing the robustness of the device 2200 according to an embodiment. The device 2200 includes a substrate 2202 having a first dielectric layer 2212 formed on the substrate 2202. For some embodiments, the substrate 2202 is a stainless steel film/foil and the first dielectric layer 2212 includes, but is not limited to, a photoresist, polyimide, KMPR, and SU-8 or other insulating materials. A first metal layer 2204 is formed on the first dielectric layer 2212. For some embodiments, the first metal layer 2204 is patterned to form a sensor in the first metal layer 2204. The sensor is a strain gauge according to an embodiment. The first metal layer 2204 has a border barrier 2206 formed around the exterior of the sensor. For some embodiments, the border barrier 2206 is an extra ring of non-active sensor material that includes, but is not limited to, constantan or other metallic materials formed on the first dielectric layer 2212 around the exterior surface of the sensor. The border barrier 2206 is positioned around the exterior of the sensor as a physical barrier to help prevent moisture ingress onto the sensor formed in the first metal layer 2204 and act as sacrificial anode that is oxidized before the sensor material in the presence of moisture/air.

The device 2200 includes a second dielectric layer 2210 formed on the first metal layer 2204 according to an embodiment. The second dielectric layer 2210 insulates and/or separates the first metal layer 2204 from other active/non-active layers of the device 2200. A second metal layer 2208 is formed on the second dielectric layer 2210 according to an embodiment. For some embodiments, the second metal layer 2208 is a sputtered layer. The second metal layer 2208 includes, but is not limited to, a sputtered chromium layer, a sputtered nickel-chromium layer, or a sputtered copper-chromium layer. For some embodiments, the second metal layer 2208 is sputtered on the second dielectric layer 2210 using techniques including those described herein. The second metal layer 2208 is positioned to cover the top surface of the sensor formed in the first metal layer 2204. For some embodiments, the second metal layer 2208 also covers the sides of the device including the sides of the sensor, the side of the second dielectric layer 2210, and the sides of the first dielectric layer 2212 all the way down to the substrate 2202. The second metal layer 2208 covers the first metal layer 2204 and/or the sides of the device to form a physical barrier that prevents moisture and oxygen from penetrating onto the sensor from the external environment of the device 2200.

For some embodiments, the second metal layer 2208 includes anti-static components. Anti-static components include, but are not limited to, chromium compounds, chromium complexes (e.g., chromium complexes with carboxylic acids), and chromium salts. Including anti-static components in the second metal layer 2208 allows the barrier formed over the sensor to protect electrical circuits from electrostatic discharge. The electrical circuits and/or other components of the sensor carrying electrical charge cause the sensor to become electrically charged. When the electrically charged sensor comes into contact with other charged objects (e.g., other electrical components or humans), static electricity is discharged and enters the sensor. Once inside the sensor, static electricity inhibits the performance (e.g., by introducing noise that impacts accuracy or disturbing sensor calibration) of the sensor. If the voltage of the static electricity discharged into the sensor is high, static electricity also destroys the electrical circuits integrated into the sensor. By suppressing and removing electrostatic buildup on the sensor and electrostatic discharge when the sensor impacts other charged objects, the anti-static components of the second metal layer 2208 improve sensor durability, reliability, and performance.

Figure 23:
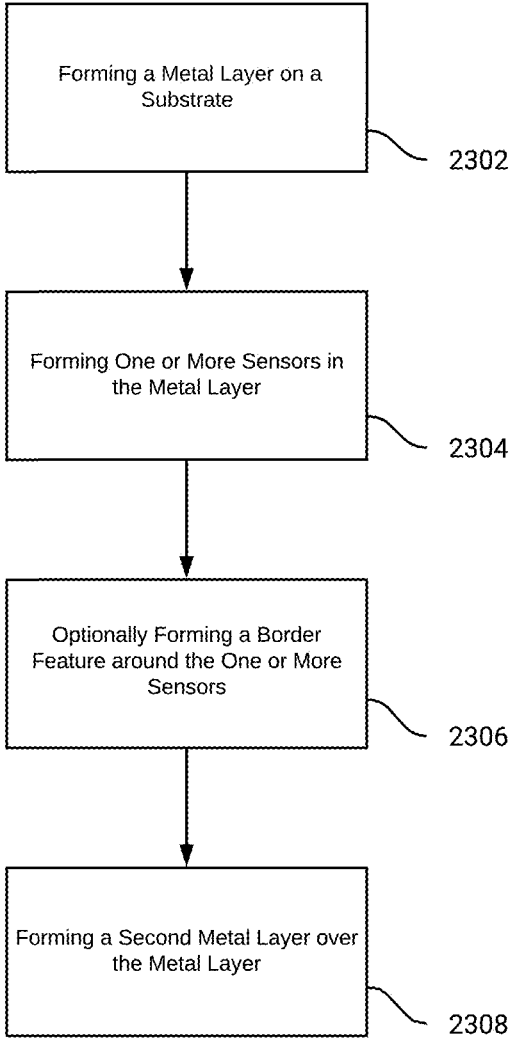
FIG. 23 is a flow diagram illustrating an exemplary method for increasing the robustness of a device according to an embodiment.

FIG. 23 illustrates an exemplary process for increasing sensor robustness. At 2302, a metal layer is formed on a substrate. The substrate may include, but is not limited, to a thin film/foil comprising stainless steel, copper, a polymer film, ceramic, glass, semiconductor, nitinol, and other materials. For some embodiments one or more dielectric layers may be formed on the substrate between the substrate and the metal layer. The metal layer includes, but is not limited to, a copper layer deposited on a seed layer of nickel-chromium sputtered on a dielectric layer formed on the substrate or a layer of constantan sputtered on a dielectric layer formed on the substrate. The metal layer is formed on a substrate using techniques including those described herein.

At 2304, the metal layer is used to form one or more sensors. For example, a resistance temperature detector (RTD), thermocouple, strain gauge, capacitance sensor, thermopile, thermistor, heater, reference electrodes, and electrical sensors/stimulators such as for electrocardiography medical electromapping patch. The sensors are formed in the metal layer using techniques including those described herein. At 2306, optionally, a border feature is formed around the one or more sensors. The border feature includes, but is not limited to, an extra ring of non-active material (e.g., constantan or other sensor material). The border feature prevents moisture ingress onto the sensor and acts as a sacrificial anode to prevent corrosion.

At 2308 a second metal layer is formed over the metal layer. For some embodiments, one or more dielectric layers may be formed over the metal layer to insulate the first metal layer and/or separate the first metal layer and the second metal layer. The second metal layer includes, but is not limited to, a plated copper layer and a sputtered chromium layer. The second metal layer is formed over the first metal layer using techniques including those described herein. The second metal layer is positioned over the one or more sensors formed in the first metal layer to form a barrier covering the sensor and preventing moisture and/or oxygen from penetrating onto the sensor. For some embodiments, the second metal layer is thermally conductive to provide a thermal spreading effect that is distributed temperature evenly across the sensor to improve sensor performance. For some embodiments, the second metal layer includes anti-static components that protect the sensor from static discharge, thereby improving sensor durability, reliability, and performance.

Although described in connection with these embodiments, those of skill in the art will recognize that changes can be made in form and detail without departing from the spirit and scope of the invention.

What is claimed is:

1. An apparatus comprising:
   a substrate;
   a first dielectric layer formed on a first side of the substrate, wherein the first dielectric layer is patterned to expose part of the substrate between portions of first dielectric layer;
   a first metal layer disposed on at least one of the portions of the first dielectric layer, wherein the first metal layer is patterned to form one or more sensors in the first metal layer;
   a second dielectric layer with patterned portions of the second dielectric layer formed over at least the one or more sensors of the first metal layer and the portions of the first dielectric layer;
   a second metal layer disposed over the second dielectric layer, the second metal layer including one or more electrical circuits and a via to electrically couple the one or more electrical circuits to the at least one of the one or more sensors formed in the first metal layer through the second dielectric layer;
   the second metal layer is positioned over the first metal layer and configured to provide a physical barrier covering the one or more sensors;
   a third dielectric layer disposed on the second metal layer, wherein the third dielectric layer is patterned to form one or more openings that expose any of the one or more electrical circuits and the via;
   a first gold plated pad disposed over any of the one or more openings in electrical communication with the one or more electrical circuits exposed via the one or more openings and configured to form a first electrical contact for the one or more electrical circuits; and
   a second gold pad disposed on a second side of the substrate opposite to the first side, the second gold pad in electrical communication with the one or more electrical circuits and the second gold pad forming a second electrical contact for the one or more electrical circuits.

2. The apparatus of claim 1, wherein the physical barrier is configured to prevent moisture or oxygen from penetrating onto the sensor.

3. The apparatus of claim 1, wherein the second metal layer is plated copper.

4. The apparatus of claim 3, wherein the plated copper provides a thermal spreading effect to distribute heat over a top surface of the one or more sensors.

5. The apparatus of claim 1, wherein the second metal layer includes sputtered chromium.

6. The apparatus of claim 5, wherein the sputtered chromium includes one or more anti-static components that reduce electrostatic discharge.

7. The apparatus of claim 1, wherein the first metal layer includes a border feature around the one or more sensors.

8. The apparatus of claim 7, wherein the border feature is a physical barrier that is configured to prevent ingress of moisture onto the one or more sensors.

9. The apparatus of claim 7, wherein the border feature is a sacrificial anode that is consumed in the presence of moisture or oxygen to prevent corrosion of the one or more sensors.

10. The apparatus of claim 1, wherein at least one of the one or more sensors is a resistance temperature detector.

11. The apparatus of claim 1, wherein at least one of the one or more sensors includes an array of resistance temperature detectors.

12. The apparatus of claim 1, wherein at least one of the one or more sensors is a pressure sensor.

13. The apparatus of claim 12, wherein the pressure sensor is a strain gauge.

14. The apparatus of claim 12, wherein the pressure sensor is a capacitive sensor.

15. The apparatus of claim 1, wherein the apparatus is part of any one of an internet of things device, a medical device, a smart sensor, a home automation device, an industrial sensor, an automotive sensor, an environmental device, a security device, a public safety device, a retail device, a logistics device, and a consumer device.

16. The apparatus of claim 1, wherein the second metal layer includes one or more sensors formed in the second metal layer.

17. The apparatus of claim 1 comprising a third metal layer disposed over the second metal layer.

18. The apparatus of claim 17, further comprising the third dielectric layer disposed between the second metal layer and the third metal layer.

19. The apparatus of claim 17, wherein the third metal layer includes one or more electrical circuits and at least one or more sensors, the third metal layer is positioned over the second metal layer and configured to provide a physical barrier.

20. A sensor comprising:
a substrate;
a first dielectric layer disposed on a first side of the substrate, wherein the first dielectric layer is patterned to expose part of the substrate between portions of first dielectric layer;
a first metal layer disposed on at least one of the portions of the first dielectric layer, the first metal layer including one or more sensor components formed in the first metal layer;
a second dielectric layer with patterned portions of the second dielectric layer formed over at least the one or more sensors of the first metal layer and the portions of the first dielectric layer;
a second metal layer disposed over the second dielectric layer, the second metal layer including one or more electrical circuits and a via to electrically couple the one or more electrical circuits to the at least one of the one or more sensors formed in the first metal layer through the second dielectric layer; a third dielectric layer disposed on the second metal layer, wherein the third dielectric layer is patterned to form one or more openings that expose any of the one or more electrical circuits and the via;
a first gold plated pad disposed over any of the one or more openings in electrical communication with the one or more electrical circuits exposed via the one or more openings and configured to form a first electrical contact for the one or more electrical circuits; and
a second gold pad disposed on a second side of the substrate opposite to the first side, the second gold pad in electrical communication with the one or more electrical circuits and the second gold pad forming a second electrical contact for the one or more electrical circuits; and
a border feature disposed around the one or more sensor components.

21. The sensor of claim 20, wherein the border feature is an extra ring of metallic material having the same composition as the metal layer.

22. The sensor of claim 20, wherein the border feature prevents the ingress of moisture onto the one or more sensor components or is a sacrificial anode that is consumed in the presence of moisture or oxygen to prevent corrosion of the one or more sensor components.

23. A method for increasing sensor robustness comprising;
disposing a first dielectric layer over a first side of a substrate, wherein the first dielectric layer is patterned to expose part of the substrate between portions of first dielectric layer;
forming a first metal layer on at least one of the portions of the first dielectric layer;
forming one or more sensors in the first metal layer;
forming a second dielectric layer with patterned portions of the second dielectric layer over at least the one or more sensors of the first metal layer and the portions of the first dielectric layer;
forming a second metal layer over the second dielectric layer, the second metal layer positioned over the one or more sensors to form a barrier that prevents moisture or oxygen from penetrating onto the one or more sensors, the second metal layer including one or more electrical circuits and a via to electrically couple the one or more electrical circuits to the at least one of the one or more sensors formed in the first metal layer through the second dielectric layer;
forming a third dielectric layer on the second metal layer, wherein the third dielectric layer is patterned to form one or more openings that expose any of the one or more electrical circuits and the via;
disposing a first gold plated pad over any of the one or more openings in electrical communication with the one or more electrical circuits exposed via the one or more openings and configured to form a first electrical contact for the one or more electrical circuits; and
disposing a second gold pad on a second side of the substrate opposite to the first side, the second gold pad in electrical communication with the one or more electrical circuits and the second gold pad forming a second electrical contact for the one or more electrical circuits.

24. The method of claim 23, further comprising forming a border feature around the one or more sensors.

25. An apparatus comprising:
a substrate;

a first dielectric layer formed on a first side of the substrate, wherein the first dielectric layer is patterned to expose part of the substrate between portions of first dielectric layer;

a first metal layer disposed on at least one of the portions of the first dielectric layer, the first metal layer including one or more electrical circuits;

a second dielectric layer with patterned portions of the second dielectric layer formed over at least the one or more electrical circuits of the first metal layer and the portions of the first dielectric layer;

a second metal layer disposed over the second dielectric layer, the second metal layer including one or more sensors;

a third dielectric layer disposed on the second metal layer, wherein the third dielectric layer is patterned to form one or more openings that expose any of the one or more electrical circuits and the via;

a third metal layer is disposed over the second metal layer and configured to provide a physical barrier covering the one or more sensors;

a first gold plated pad disposed over any of the one or more openings in electrical communication with the one or more electrical circuits exposed via the one or more openings and configured to form a first electrical contact for the one or more electrical circuits; and a second gold pad disposed on a second side of the substrate opposite to the first side, the second gold pad in electrical communication with the one or more electrical circuits and the second gold pad forming a second electrical contact for the one or more electrical circuits.

* * * * *